(12) United States Patent
Chen

(10) Patent No.: US 10,833,031 B2
(45) Date of Patent: Nov. 10, 2020

(54) PAD DESIGN FOR RELIABILITY ENHANCEMENT IN PACKAGES

(71) Applicant: Taiwan Semiconductor Manufacturing Company, Ltd., Hsinchu (TW)

(72) Inventor: Hsien-Wei Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/390,589

(22) Filed: Apr. 22, 2019

(65) Prior Publication Data
US 2019/0259720 A1 Aug. 22, 2019

Related U.S. Application Data

(60) Division of application No. 15/817,704, filed on Nov. 20, 2017, now Pat. No. 10,269,745, which is a (Continued)

(51) Int. Cl.
*H01L 23/00* (2006.01)
*H01L 25/07* (2006.01)
(Continued)

(52) U.S. Cl.
CPC ........ *H01L 24/09* (2013.01); *H01L 21/31111* (2013.01); *H01L 23/3114* (2013.01); *H01L 23/3128* (2013.01); *H01L 23/49838* (2013.01); *H01L 24/03* (2013.01); *H01L 24/19* (2013.01); *H01L 24/20* (2013.01); *H01L 25/0657* (2013.01); *H01L 25/071* (2013.01); *H01L 21/486* (2013.01); *H01L 23/49811* (2013.01); *H01L 23/49816* (2013.01); *H01L 23/49827* (2013.01); *H01L 24/13* (2013.01); *H01L 24/16* (2013.01); *H01L 24/32* (2013.01); *H01L 24/48* (2013.01); *H01L 2224/04026* (2013.01);
(Continued)

(58) Field of Classification Search
CPC ......... H01L 24/09; H01L 24/19; H01L 24/48; H01L 24/32; H01L 24/16; H01L 24/13; H01L 23/49827; H01L 21/486
See application file for complete search history.

(56) References Cited

U.S. PATENT DOCUMENTS 6,268,568 B1 7/2001 Kim
7,479,705 B2 1/2009 Takahashi et al.
(Continued)

FOREIGN PATENT DOCUMENTS

WO 2014194669 A1 12/2014

OTHER PUBLICATIONS

Definition of "Corner," http://www.merriam-webster.com/dictionary/corner, 2016, 1 page.

*Primary Examiner* — Michele Fan
(74) *Attorney, Agent, or Firm* — Slater Matsil, LLP

(57) ABSTRACT

A package includes a corner, a device die, a molding material molding the device die therein, and a plurality of bonding features. The plurality of bonding features includes a corner bonding feature at the corner, wherein the corner bonding feature is elongated. The plurality of bonding features further includes an additional bonding feature, which is non-elongated.

20 Claims, 29 Drawing Sheets

Related U.S. Application Data continuation of application No. 14/865,832, filed on Sep. 25, 2015, now Pat. No. 9,824,990, which is a continuation-in-part of application No. 14/613,997, filed on Feb. 4, 2015, now Pat. No. 9,881,857.

(60) Provisional application No. 62/011,432, filed on Jun. 12, 2014.

(51) Int. Cl.
  *H01L 23/31* (2006.01)
  *H01L 21/311* (2006.01)
  *H01L 23/498* (2006.01)
  *H01L 25/065* (2006.01)
  *H01L 21/48* (2006.01)

(52) U.S. Cl.
  CPC ........... *H01L 2224/04105* (2013.01); *H01L 2224/12105* (2013.01); *H01L 2224/13147* (2013.01); *H01L 2224/14179* (2013.01); *H01L 2224/16225* (2013.01); *H01L 2224/16227* (2013.01); *H01L 2224/22* (2013.01); *H01L 2224/32145* (2013.01); *H01L 2224/32225* (2013.01); *H01L 2224/48091* (2013.01); *H01L 2224/48227* (2013.01); *H01L 2224/73215* (2013.01); *H01L 2224/73253* (2013.01); *H01L 2224/73265* (2013.01); *H01L 2224/73267* (2013.01); *H01L 2924/00014* (2013.01); *H01L 2924/15311* (2013.01); *H01L 2924/181* (2013.01); *H01L 2924/18162* (2013.01)

(56) References Cited

U.S. PATENT DOCUMENTS

| | | | |
|---|---|---|---|
| 7,498,196 | B2 | 3/2009 | Lee et al. |
| 7,884,482 | B2 | 2/2011 | Ozawa et al. |
| 8,178,392 | B2 | 5/2012 | Choi et al. |
| 8,288,871 | B1 | 10/2012 | Shieh et al. |
| 8,361,842 | B2 | 1/2013 | Yu et al. |
| 8,680,647 | B2 | 3/2014 | Yu et al. |
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 9,142,487 | B2 | 9/2015 | Toh et al. |
| 9,233,835 | B2 | 1/2016 | Aleksov et al. |
| 9,640,624 | B2 | 5/2017 | Cheng |
| 9,711,485 | B1 * | 7/2017 | Berry .................. H01L 24/14 |
| 9,824,990 | B2 | 11/2017 | Chen |
| 9,881,857 | B2 | 1/2018 | Chen et al. |
| 2003/0008156 | A1 | 1/2003 | Pocius et al. |
| 2003/0164554 | A1 | 9/2003 | Fee et al. |
| 2004/0070064 | A1 * | 4/2004 | Yamane .............. H01L 23/3114 257/686 |
| 2004/0099936 | A1 | 5/2004 | Caletka et al. |
| 2005/0023033 | A1 | 2/2005 | Saiki et al. |
| 2005/0087886 | A1 * | 4/2005 | Leinbach .......... H01L 23/49838 257/786 |
| 2008/0136004 | A1 | 6/2008 | Yang et al. |
| 2008/0185735 | A1 | 8/2008 | Pham et al. |
| 2008/0217384 | A1 | 9/2008 | Jayantha et al. |
| 2008/0246135 | A1 | 10/2008 | Wong et al. |
| 2009/0166824 | A1 | 7/2009 | Do et al. |
| 2009/0289346 | A1 | 11/2009 | Lee et al. |
| 2010/0072588 | A1 * | 3/2010 | Yang ................. H01L 23/49816 257/676 |
| 2010/0283141 | A1 | 11/2010 | Chang et al. |
| 2011/0006422 | A1 | 1/2011 | Daubenspeck et al. |
| 2011/0108981 | A1 * | 5/2011 | Rahim ................ H01L 23/3171 257/737 |
| 2011/0235296 | A1 | 9/2011 | Shi et al. |
| 2011/0291288 | A1 | 12/2011 | Wu et al. |
| 2012/0028411 | A1 | 2/2012 | Yu et al. |
| 2012/0098120 | A1 | 4/2012 | Yu et al. |
| 2012/0104562 | A1 * | 5/2012 | Pagaila ................. H01L 21/561 257/621 |
| 2012/0153459 | A1 | 6/2012 | Wang |
| 2012/0211885 | A1 * | 8/2012 | Choi .................... H01L 23/3128 257/737 |
| 2012/0248715 | A1 | 10/2012 | Kondo et al. |
| 2012/0273960 | A1 * | 11/2012 | Park .................... H01L 21/4846 257/774 |
| 2013/0026468 | A1 | 1/2013 | Yoshimuta et al. |
| 2013/0037944 | A1 * | 2/2013 | Lee ..................... H01L 25/0657 257/737 |
| 2013/0062760 | A1 | 3/2013 | Hung et al. |
| 2013/0062761 | A1 | 3/2013 | Lin et al. |
| 2013/0075936 | A1 | 3/2013 | Lin et al. |
| 2013/0105966 | A1 | 5/2013 | Kelkar et al. |
| 2013/0168848 | A1 | 7/2013 | Lin et al. |
| 2013/0307140 | A1 | 11/2013 | Huang et al. |
| 2014/0035148 | A1 | 2/2014 | Chuang et al. |
| 2014/0035156 | A1 | 2/2014 | Hsu et al. |
| 2014/0077366 | A1 * | 3/2014 | Kim ........................ H01L 24/19 257/737 |
| 2014/0175671 | A1 | 6/2014 | Haba et al. |
| 2014/0203429 | A1 | 7/2014 | Yu et al. |
| 2014/0225222 | A1 | 8/2014 | Yu et al. |
| 2014/0247561 | A1 | 9/2014 | Inui |
| 2014/0252646 | A1 | 9/2014 | Hung et al. |
| 2014/0264930 | A1 | 9/2014 | Yu et al. |
| 2014/0367852 | A1 * | 12/2014 | Tien ....................... H01L 24/14 257/737 |
| 2015/0041980 | A1 * | 2/2015 | Ahn ........................ H01L 24/94 257/738 |
| 2016/0056127 | A1 * | 2/2016 | Lee ..................... H01L 25/0657 257/659 |
| 2016/0133601 | A1 * | 5/2016 | Ko .......................... H01L 21/78 257/738 |
| 2017/0069532 | A1 * | 3/2017 | Lee ..................... H01L 23/5389 |
| 2017/0133310 | A1 * | 5/2017 | Kelly ................. H01L 23/49816 |

\* cited by examiner

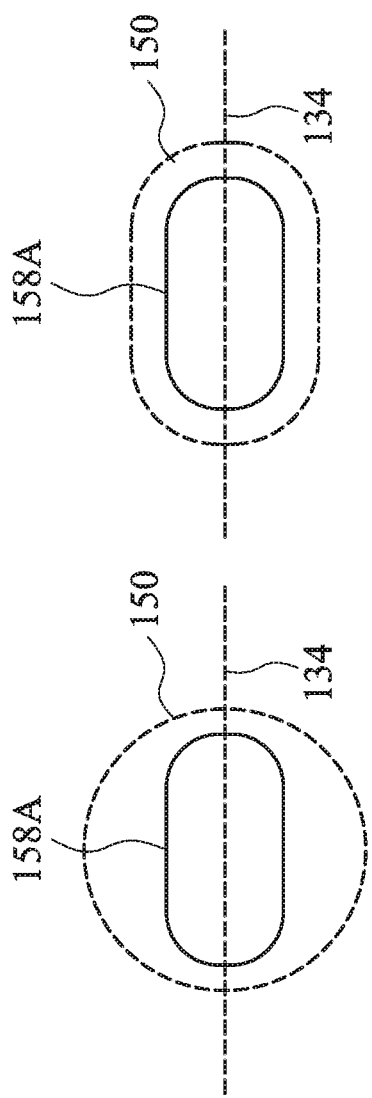

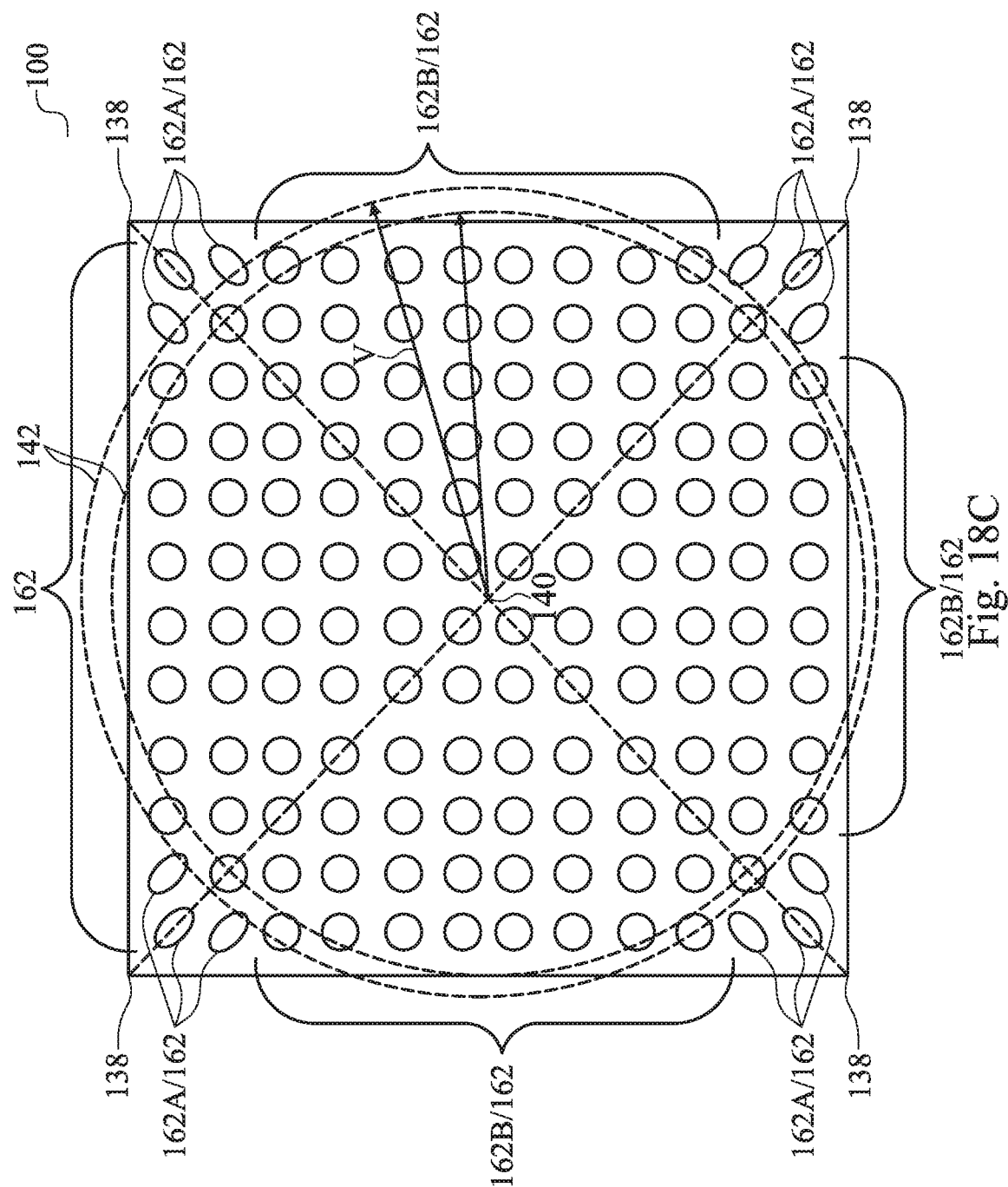

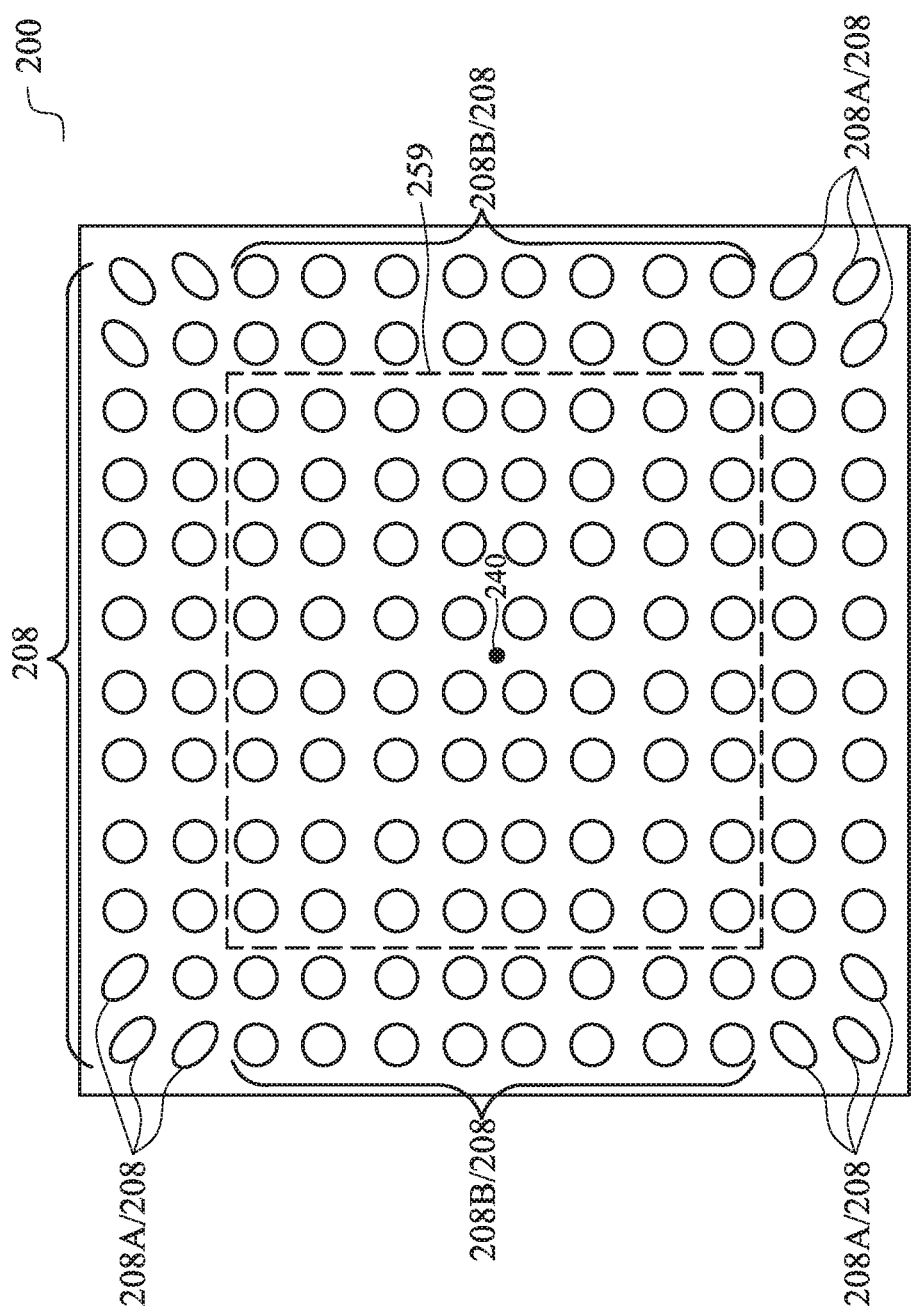

US 10,833,031 B2

PAD DESIGN FOR RELIABILITY ENHANCEMENT IN PACKAGES

PRIORITY CLAIM AND CROSS-REFERENCE

This application is a divisional of U.S. patent application Ser. No. 15/817,704, entitled "Pad Design for Reliability Enhancement in Packages," filed on Nov. 20, 2017, which is a continuation of U.S. patent application Ser. No. 14/865,832, entitled "Pad Design for Reliability Enhancement in Packages," and filed Sep. 25, 2015, now U.S. Pat. No. 9,824,990 issued Nov. 21, 2017, which is a continuation-in-part application of the following commonly-assigned U.S. patent application Ser. No. 14/613,997, filed Feb. 4, 2015, and entitled "Pad Design for Reliability Enhancement in Packages," now U.S. Pat. No. 9,881,857 issued Jan. 30, 2018, which further claims the benefit of the following U.S. Provisional Application No. 62/011,432, filed Jun. 12, 2014, and entitled "Integrated Circuit Package Pad and Method of Forming Same," which applications are hereby incorporated herein by reference.

BACKGROUND

In the packaging of integrated circuits, there are various types of packaging methods and structures. For example, in a conventional Package-on-Package (POP) process, a top package is bonded to a bottom package. The top package and the bottom package may also have device dies packaged therein. By adopting the PoP process, the integration level of the packages is increased.

In an existing PoP process, the bottom package, which includes a device die bonded to a package substrate, is formed first. A molding compound is molded to the package substrate, wherein the device die is molded in the molding compound. The package substrate further includes solder balls formed thereon, wherein the solder balls and the device die are on a same side of the package substrate. The solder balls are used for connecting the top package to the bottom package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 12A and 12B illustrate the exemplary shapes of elongated openings and their respective underlying metal pads in accordance with some embodiments;

FIGS. 14 through 18A illustrate the cross-sectional views of intermediate stages in the formation of a package in accordance with some embodiments;

FIGS. 18B and 18C illustrate the top views of a portion of a package in accordance with some embodiments;

FIGS. 27A and 27B illustrate bottom views of some exemplary metal pads in a top package in accordance with some embodiments.

DETAILED DESCRIPTION

Figure 1:
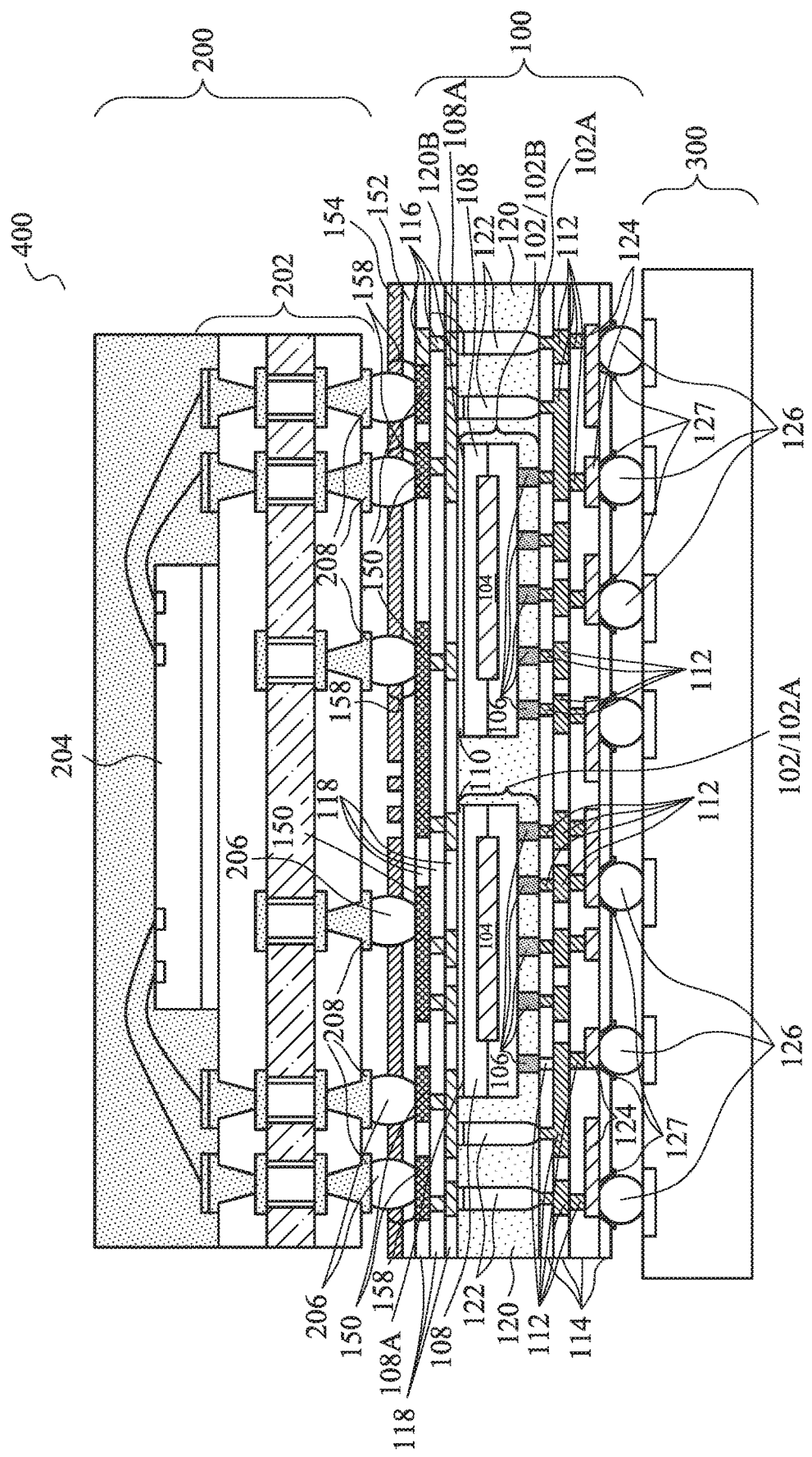
FIG. 1 illustrates a cross-sectional view of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated fan-out package and the structure for improving the reliability of the package are provided in accordance with various exemplary embodiments. The variations of the embodiments are discussed. Throughout the various views and illustrative embodiments, like reference numbers are used to designate like elements.

FIG. 1 illustrates a cross-sectional view of package 40 in accordance with some exemplary embodiments of the present disclosure. Package 400 includes bottom package 100 and top package 200 over and bonded to bottom package 100. Both bottom package 100 and top package 200 are pre-formed, and are then bonded to each other to form a package on package structure. In accordance with some embodiments of the present disclosure, bottom package 100 includes device dies 102 (including 102A and 102B), with the front sides of device dies 102 facing down and bonded to Redistribution Lines (RDLs) 112. In alternative embodiments, bottom package 100 includes a single device die or more than two device dies. Device dies 102 may include semiconductor substrates 108, and integrated circuit devices (such as active devices, which include transistors, for example) 104 at the front surface (the surface facing down) of semiconductor substrates 108. Device dies 102 may include logic dies such as Central Processing Unit (CPU) dies, Graphic Processing Unit (GPU) dies, mobile application dies, or the like.

Device dies 102 are molded in molding material 120, which surrounds device dies 102. Molding material 120 may be a molding compound, a molding underfill, a resin, or the like. The bottom surface 120A of molding material 120 may be leveled with the bottom ends of device dies 102. The top surface 120B of molding material 120 may be level with or higher than back surfaces 108A of semiconductor substrates 108. In accordance with some embodiments of the present disclosure, back surfaces 108A of semiconductor substrates 108 are overlapped by die-attach films 110, which adhere device dies 102 to the overlying dielectric layer 118 and RDLs 116. Device dies 102 further include metal pillars 106 (which may include copper pillars) in contact with, and bonded to, RDLs 112.

Bottom package 100 may include Front-side RDLs 112 underlying device dies 102 and back-side RDLs 116 overlying device dies 102. The term "front-side RDL" indicates that the respective RDLs are on the front side of device dies 102, and the term "back-side RDL" indicates that the respective RDLs are on the back side of device dies 102. Front-side RDLs 112 are formed in dielectric layers 114, and back-side RDLs 116 are formed in dielectric layers 118. RDLs 112 and 116 may be formed of copper, aluminum, nickel, alloys thereof, or multi-layers thereof. In accordance with some embodiments of the present disclosure, dielectric layers 114 and 118 are formed of inorganic materials such as silicon oxide, silicon nitride, silicon oxynitride, or the like. In alternative embodiments, dielectric layers 114 and 118 are formed of organic materials such as polymers, which may include polybenzoxazole (PBO), benzocyclobutene (BCB), polyimide, or the like.

Through-Vias 122 are formed to penetrate through molding material 120. In accordance with some embodiments of the present disclosure, through-vias 122 have top surfaces level with the top surface of molding material 120 and bottom surfaces level with the bottom surface of molding material 120. Through-Vias 122 electrically connect front-side RDLs 112 and device dies 102A and 102B to back-side RDLs 116. Through-Vias 122 may also be in physical contact with some of front-side RDLs 112 and back-side RDLs 116.

Electrical connectors 124, which are formed of a non-solder metallic material(s), are formed at the bottom surface of bottom package 100. In accordance with some embodiments of the present disclosure, electrical connectors 124 are metal pads. In alternative embodiments, electrical connectors 124 include metal pillars such as copper pillars. Throughout the description, electrical connectors 124 are referred to as metal pads 124, although they may have forms other than metal pads. Metal pads 124 may comprise copper, aluminum, nickel, palladium, gold, or multi-layers thereof. Solder regions 126 are attached to the bottom surfaces of metal pads 124 and bond bottom package 100 to package component 300. In some exemplary embodiments, Under Bump Metallurgies (UBMs) 127 are formed at the bottom surface of package component 100, with solder regions 126 attached on. In alternative embodiments, no UBM is formed, and solder regions 126 are in contact with metal pads 124. Package component 300 may include a Printed Circuit Board (PCB), a package, or another type of package component.

The back-side RDLs 116 includes some metal pads 150. In accordance with some embodiments, metal pads 150 are in the topmost RDL layer in package component 100. Polymer layer 152 is formed over RDLs 116 and dielectric layers 118. Dielectric layer 152 may be formed of a polymer such as PBO or other organic or inorganic materials. Throughout the description, dielectric layer 152 is referred to as polymer layer 152 although it may also be formed of a dielectric material other than polymer. In accordance with some embodiments, tape 154 is over and attached to dielectric layer 152. Tape 154 is used to provide protection and reinforcement to the underlying structure. Furthermore, laser marks 156 may be formed in tape 154. Laser marks 156 are recesses/openings in tape 154 and may be formed through laser. The top-view shape of laser marks 156 may include letters, numbers, graphics, and/or the like. Hence, laser marks 156 may be used for identification purposes. In alternative embodiments, tape 154 is not formed, and polymer layer 152 is the top layer of package component 100.

Openings 158 are formed in polymer layer 152 and tape 154, and metal pads 150 are exposed to opening 158. Solder regions 206 have their bottom portions filling openings 158, with solder regions 206 in contact with metal pads 150.

Top package 200 is bonded to bottom package 100. In accordance with some embodiments of the present disclosure, top package 200 includes package substrate 202 and device die 204, which is bonded to package substrate 202. The bonding of device die 204 to package substrate 202 may be achieved through wire bonding, flip-chip bonding, or the like. Solder regions 206 bond top package 200 to bottom package 100. Furthermore, solder regions 206 are in contact with metal pads 208 at the bottom surface of package component 200. Accordingly, solder regions 206 have their top surface in contact with metal pads 208 and bottom surfaces in contact with the top surfaces of metal pads 150.

Figure 2:
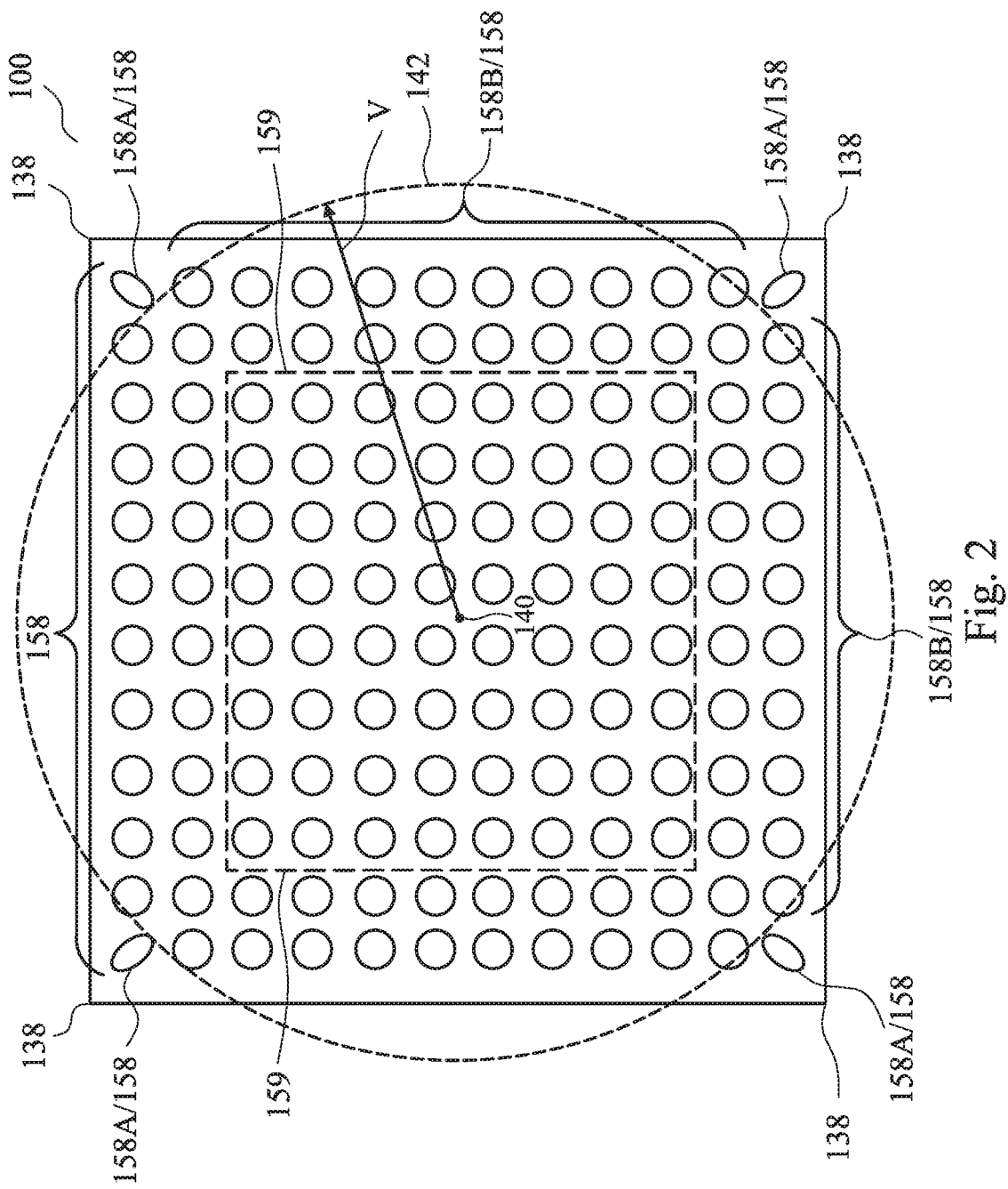
FIG. 2 illustrates the top view of a package and openings in a top dielectric layer of the package in accordance with some embodiments, wherein corner openings are elongated connectors.

FIG. 2 illustrates a schematic top view of portions of bottom package 100, wherein openings 158 in polymer layer 152 (and tape 154, if any, FIG. 1) are illustrated. Openings 158 include elongated openings 158A and non-elongated openings 158B. In FIGS. 2 through 9, circles are used to schematically represent non-elongated openings 158B, and ovals are used to schematically represent elongated openings 158A. FIGS. 10A and 10B illustrate top views of some exemplary elongated openings 158A. In each of FIGS. 10A and 10B, elongated opening 158A has length L1 measured in lengthwise direction X and width W1 measured in widthwise direction Y, which is perpendicular to lengthwise direction X. Length L1 is greater than width W1. Elongated opening 158A includes longer axis 134 in lengthwise direction X and shorter axis 136 in widthwise direction Y. Throughout the description, an elongated opening 158A is an opening whose length-to-width ratio L1/W1 is greater than threshold ratio Lt that is greater than 1. Threshold ratio Lt may be greater than about 1.2, 1.6, or 2.0.

Elongated opening 158A may have various shapes including, but not limited to, an oval shape, a rectangular shape, an elongated octagonal shape, or the like. For example, FIG. 10A illustrates an exemplary elongated opening 158A, which includes two half circles 130 connected to opposite edges of rectangle 128. FIG. 10B illustrates an elongated hexagon. It is appreciated that other elongated shapes other than what have been discussed may also be used.

Figure 10B:
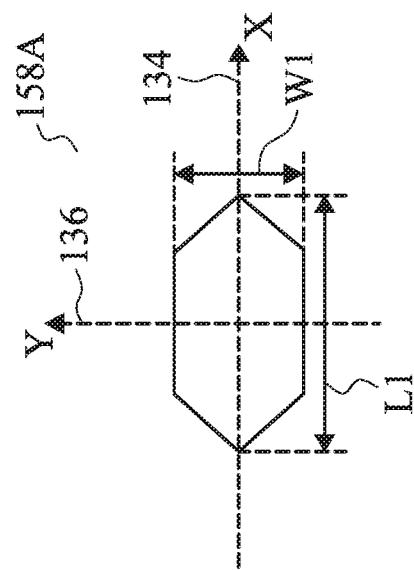
FIGS. 10A and 10B illustrate top views of some exemplary elongated openings.
Figure 10A:
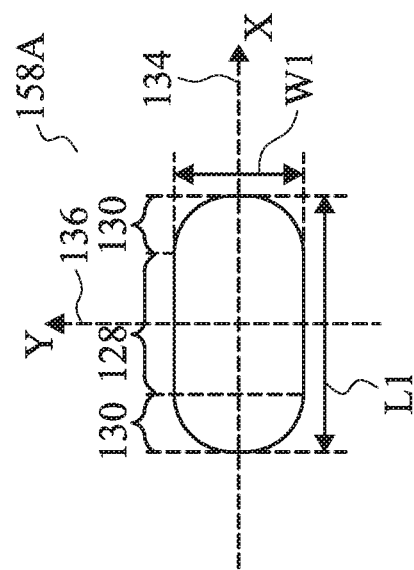
Figure 11A:
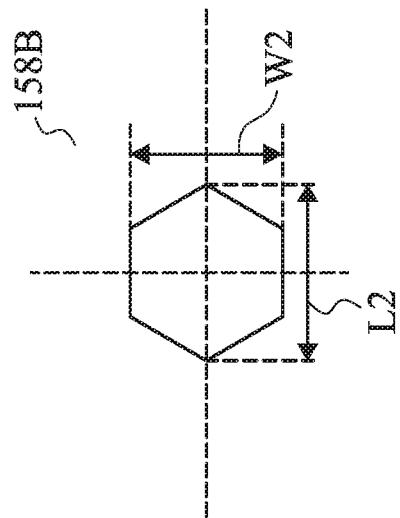
FIGS. 11A and 11B illustrate top views of some exemplary non-elongated openings in accordance with some embodiments.
Figure 11B:
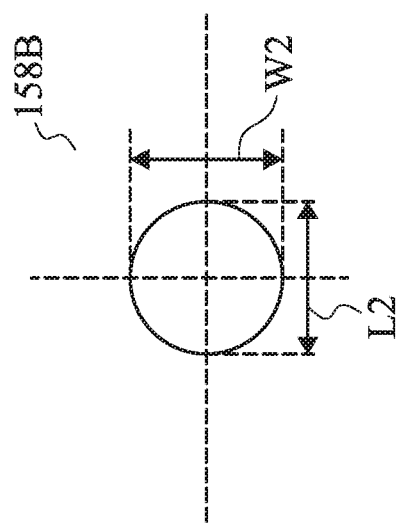

FIGS. 11A and 11B illustrate the top views of exemplary non-elongated openings 158B. Throughout the description, a non-elongated opening 158B does not have length L2 and width W2 observably different from each other. Alternatively, a non-elongated opening 158B has width W2 smaller than length L2, with length-to-width ratio L2/W2 being smaller than the threshold ratio Lt, which may be smaller than about 1.2 or about 1.1 in accordance with some exemplary embodiments. For example, FIGS. 11A and 11B illustrate non-elongated openings 158B, which have a circular bottom-view shape and a hexagonal bottom-view shape, respectively. Furthermore, in the same package 100, length-to-width ratio L1/W1 of elongated openings 158A is greater than length-to-width ratio L2/W2 of non-elongated openings 158B. The top areas (which can be viewed from FIGS. 10A, 10B, 11A, and 11B) of elongated openings 158A may be equal to the top-view areas of non-elongated openings 158B, although they have different shapes.

Although not shown in FIGS. 10A, 10B, 11A, and 11B, the top views of solder regions 206 (FIG. 1) are defined by, and may be the same as, the top-view shapes of the respective underlying openings 158. Hence, solder regions 206 may also include elongated solder regions (in the top view of package component 100) and non-elongated solder regions.

Referring back to FIG. 2, bottom package 100 includes four corners 138. The corner openings 158, which are closer to the respective corners 138 than all other openings, are elongated openings 158A. Other openings 158 that are farther away from the respective corners 138 than the corner openings 158A are non-elongated openings 158B. In accordance with some embodiments of the present disclosure, there may be more than one elongated opening 158A at each corner 138. For example, as shown in FIG. 3, there are three elongated openings 158A at each corner 138.

Figure 3:
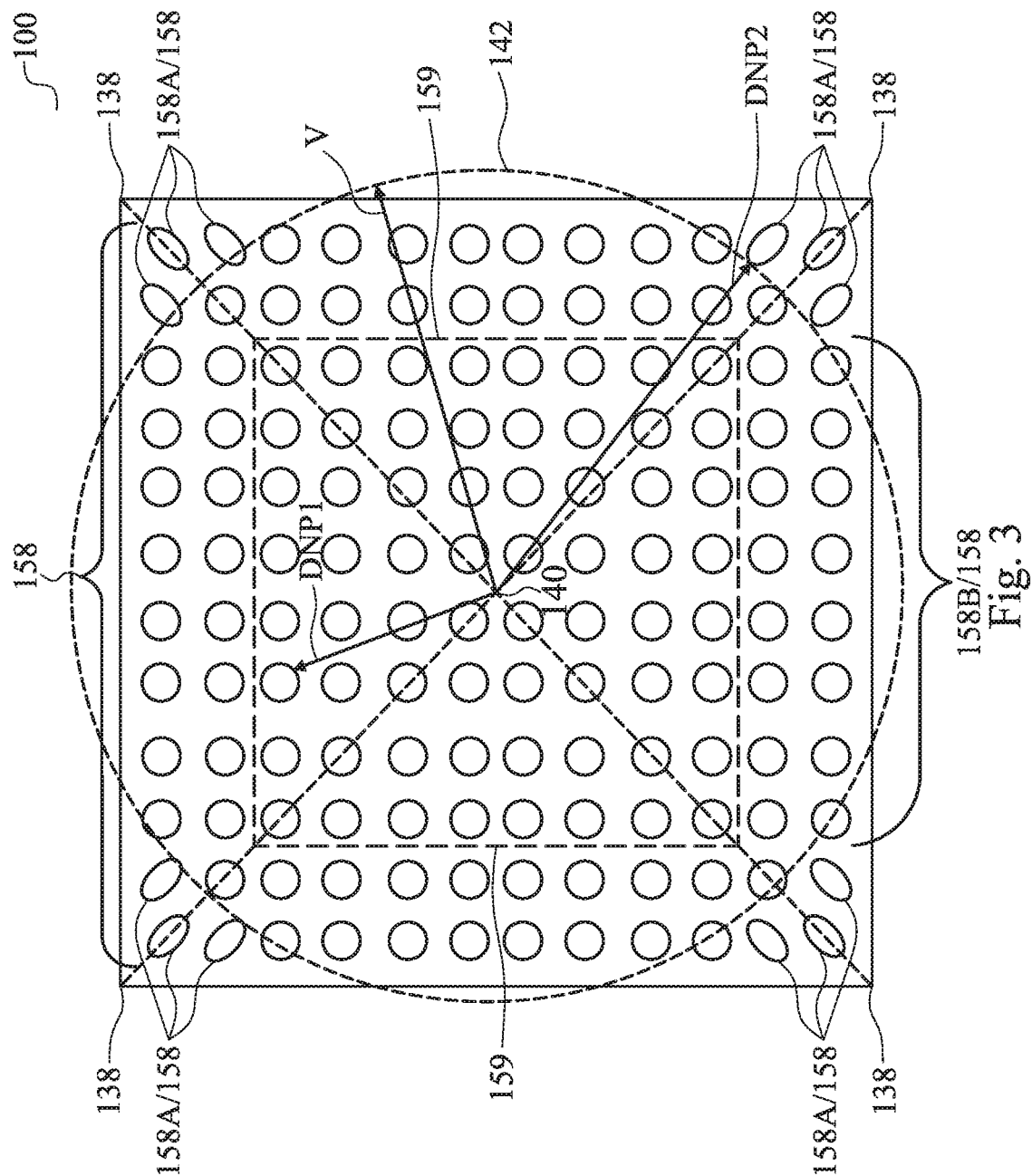
FIG. 3 illustrates the top view of a package and openings in a top dielectric layer of the package in accordance with some embodiments, wherein a plurality of elongated openings is distributed to each corner.
Figure 4:
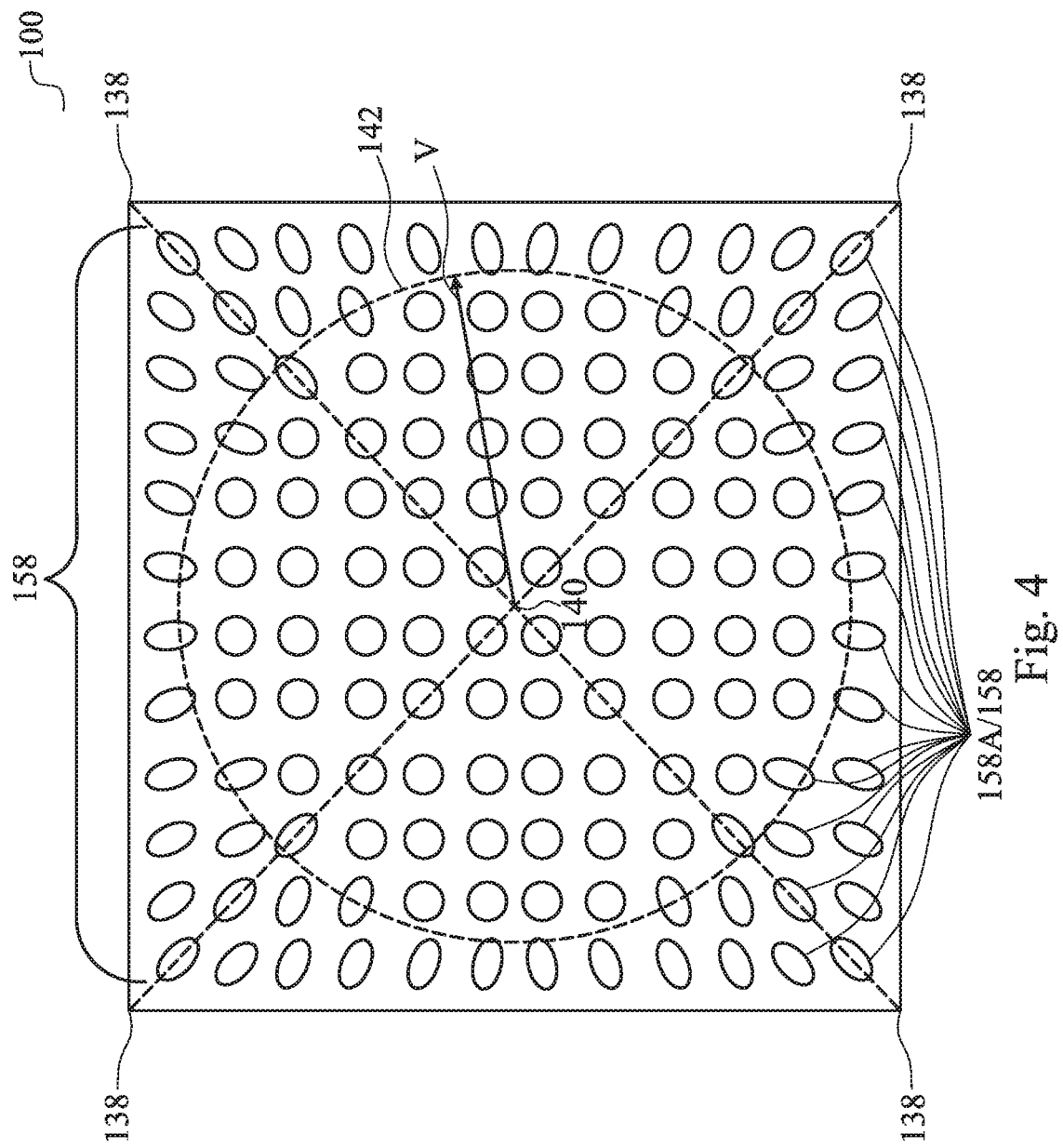
FIG. 4 illustrates the top view of a package and non-solder openings of the package in accordance with some embodiments, wherein elongated openings and non-elongated openings are distributed depending on their distances to a neutral-stress point of the package.

FIGS. 3 and 4 illustrate the top views of bottom package 100 and openings 158 in accordance with alternative embodiments. In the top view, bottom package 100 has neutral-stress point 140, which is the point substantially free from stresses from all lateral directions that are parallel to the bottom surface of package 100. At neutral-stress point 140, the lateral stresses from opposite directions are cancelled out. The lateral stresses are the stresses parallel to the top and bottom surfaces of package component 100 in FIG. 1. In accordance with some embodiments of the present disclosure, neutral-stress point 140 is at or close to the center of bottom package 100 (in the top view). The distance between each of openings 158 and neutral-stress point 140 is referred to as a Distance to Neutral Point (DNP) of the respective opening 158, wherein the distance of an opening 158 is measured from a point of the opening 158 that is closest to neutral-stress point 140. For example, DNPs DNP1 and DNP2 are illustrated as examples in FIG. 3.

As shown in FIGS. 3 and 4, a circle 142 is drawn with neutral-stress point 140 as the center, wherein circle 142 has radius r. In accordance with the embodiments of the present disclosure, all openings 158 with DNPs equal to or smaller than radius r are designed as non-elongated openings 158B, and all openings 158 with DNPs greater than radius r are designed to be elongated openings 158A. As illustrated in FIG. 3, if radius r is large, then the elongated openings include corner openings. In these embodiments, each row includes at least one (or more) opening that is a non-elongated opening. In FIG. 4, radius r is reduced, and hence an entire edge-row or edge-column of openings 158 whose DNPs are greater than radius r are elongated, while the openings 158 with the DNPs equal to or smaller than radius r are non-elongated. In the embodiments in FIGS. 3 and 4, the elongated openings 158A include corner openings.

Radius r is determined based on the stresses suffered by solder regions 206 and metal pads 150 (FIG. 1) and may be based on measurement results from packages and/or simulation results. In some embodiments, radius r is selected by ensuring the stresses suffered by all solder regions 206 and metal pads 150 in circle 142 (FIGS. 3 and 4) to be lower than a pre-determined threshold stress, while the stresses suffered by at least some solder regions 206 and metal pads 150 outside circle 142 are higher than the threshold stress.

Figure 5:
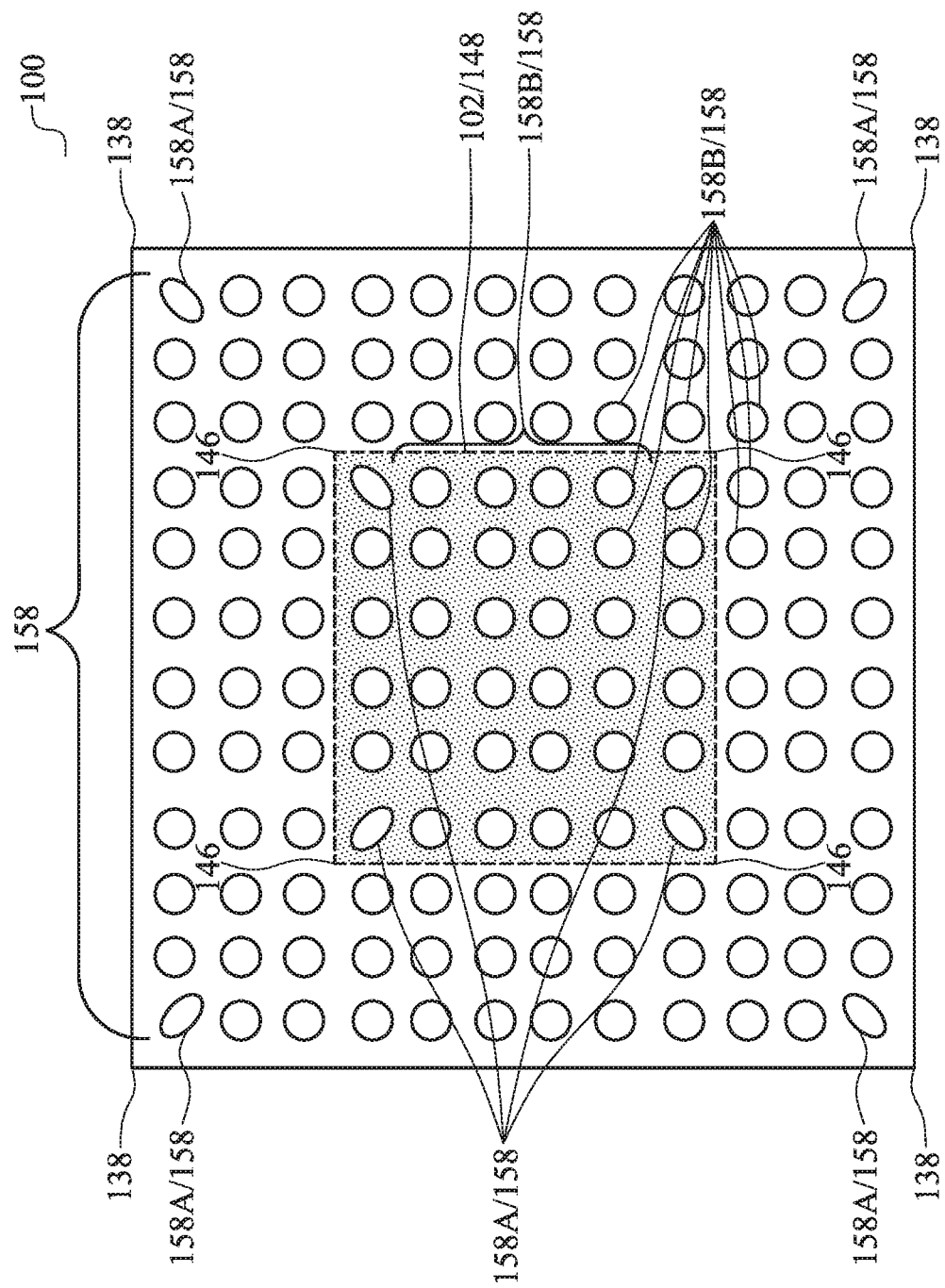
FIG. 5 illustrates a top view of a package and openings in a top dielectric layer of the package in accordance with some embodiments, wherein inner openings adjacent to the corners of an underlying device die are elongated.

In accordance with some embodiments, openings 158 are distributed as an array that is distributed throughout package 100, as shown in FIGS. 3 through 5. In alternative embodiments, openings 158 are distributed close to the peripheral regions of package 100, and are not in the inner regions. For example, FIGS. 2 and 3 schematically illustrate dashed rectangular regions 159. In these embodiments, openings 158 will be formed outside of rectangular regions 159, and will not be formed inside rectangular regions 159.

FIG. 5 illustrates the top view of some components in bottom package 100 and openings 158 in accordance with yet alternative embodiments. Device die 102 is illustrated in the top view. Device die 102 includes corners 146. Solder regions that are close to the corners 146 suffer from higher stresses than other nearby solder regions and hence are more prone to failure. In accordance with some embodiments of the present disclosure, the inner openings 158 (which are not edge openings and not corner opening of package 100) that overlap (also refer to FIG. 1) device die 102 and are also closest to corners 146 are elongated openings 158A, while other openings 158 (except the openings 158A discussed in the embodiments in FIGS. 2 through 4) are non-elongated openings 158B. In accordance with some embodiments of the present disclosure, the inner elongated openings 158A are surrounded by non-elongated openings 158B.

Figure 6:
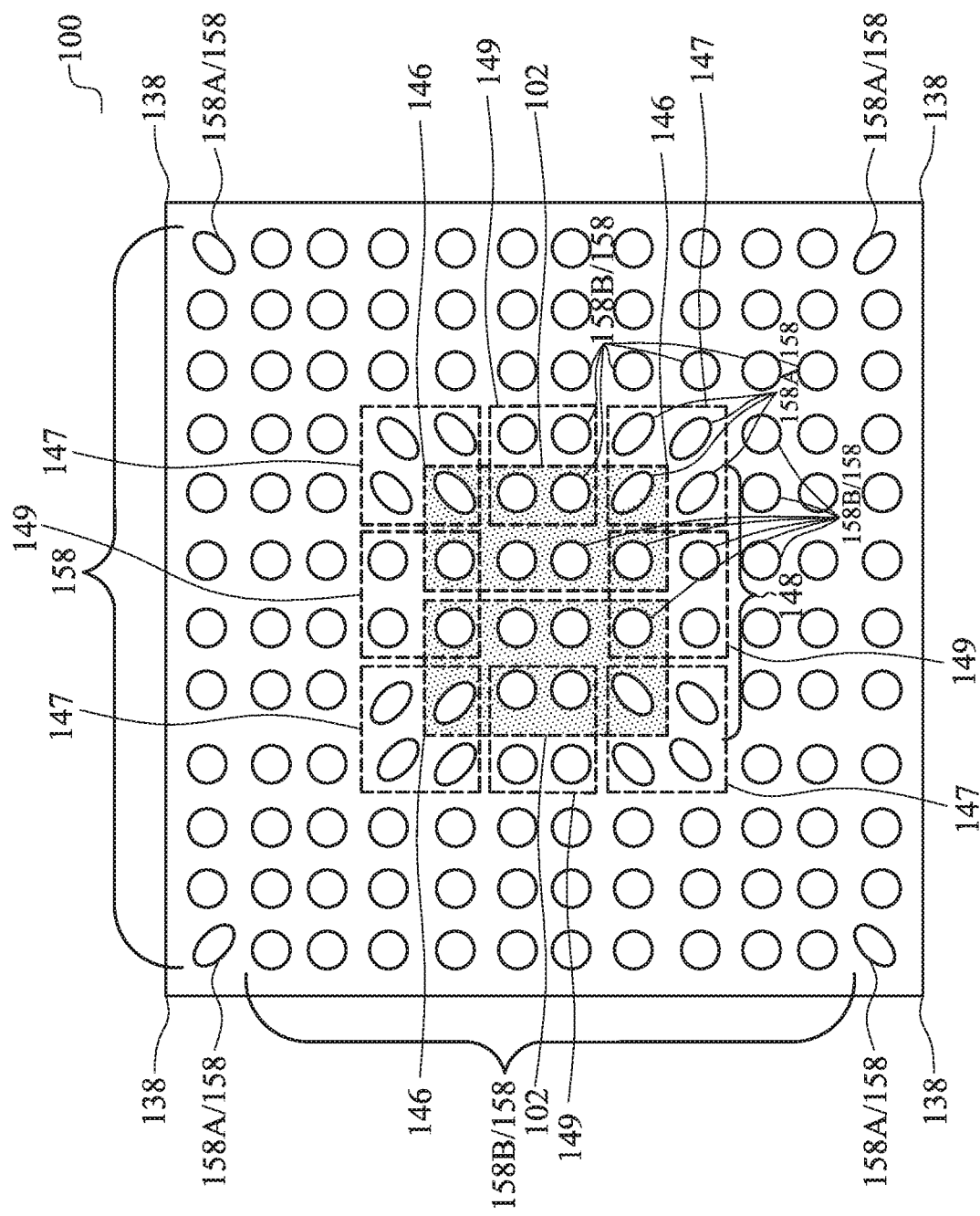
FIG. 6 illustrates the top view of a package and openings in a top dielectric layer of the package in accordance with some embodiments, wherein inner openings adjacent to the corners of an underlying device die group are elongated.

FIG. 6 illustrates some components in the top view of bottom package 100 and openings 158 in accordance with yet alternative embodiments. In these embodiments, a plurality of device dies 102 is closely located from each other to form device die group 148. Device die group 148 includes corners 146. In accordance with some embodiments of the present disclosure, there are four corner regions 147, each at a corner 146. There are four openings 158 in each of corner regions 147, wherein the four openings 158 are closest to the respective corner 146. Each of the four openings 158 in each corner region 147 includes one opening that overlaps die group 148 and three openings 158 that do not overlap die group 148. All four openings 158 in each corner region 147 are elongated openings 158A, while other openings 158 in the regions surrounding each of corner regions 147 are non-elongated openings 158B.

There is also a plurality of edge regions 149 that overlaps the edges of die group 148. In each of edge regions 149, there are two rows of openings 158, with each of the two rows extending in the direction parallel to the respective edge of die group 148. One of the rows of openings 158 overlaps die group 148, and the other row of openings 158 does not overlap die group. In accordance with some embodiments of the present disclosure, edge openings 158 in edge regions 149 are non-elongated openings 158B. In alternative embodiments, edge openings 158 in edge regions 149 are elongated openings 158A.

In accordance with some embodiments as shown in FIGS. 5 and 6, the inner openings 158 that are overlapped by device die group 148, whose openings 158 are also closest to corners 146, are elongated openings 158A, while other openings 158 (except the openings 158A discussed in the embodiments in FIGS. 2 through 4) are non-elongated openings 158B. In accordance with some embodiments of the present disclosure, the inner elongated openings 158A are surrounded by non-elongated openings 158B.

In the above-discussed embodiments referring to FIG. 6, die group 148 includes two dies. In alternative embodiments, die group 148 may include a single die or more than two dies. For example, as shown in FIG. 5, when die group 148 includes a single die, then the die corners 146 as in FIG. 6 will be the four corners of the single die.

Figure 7:
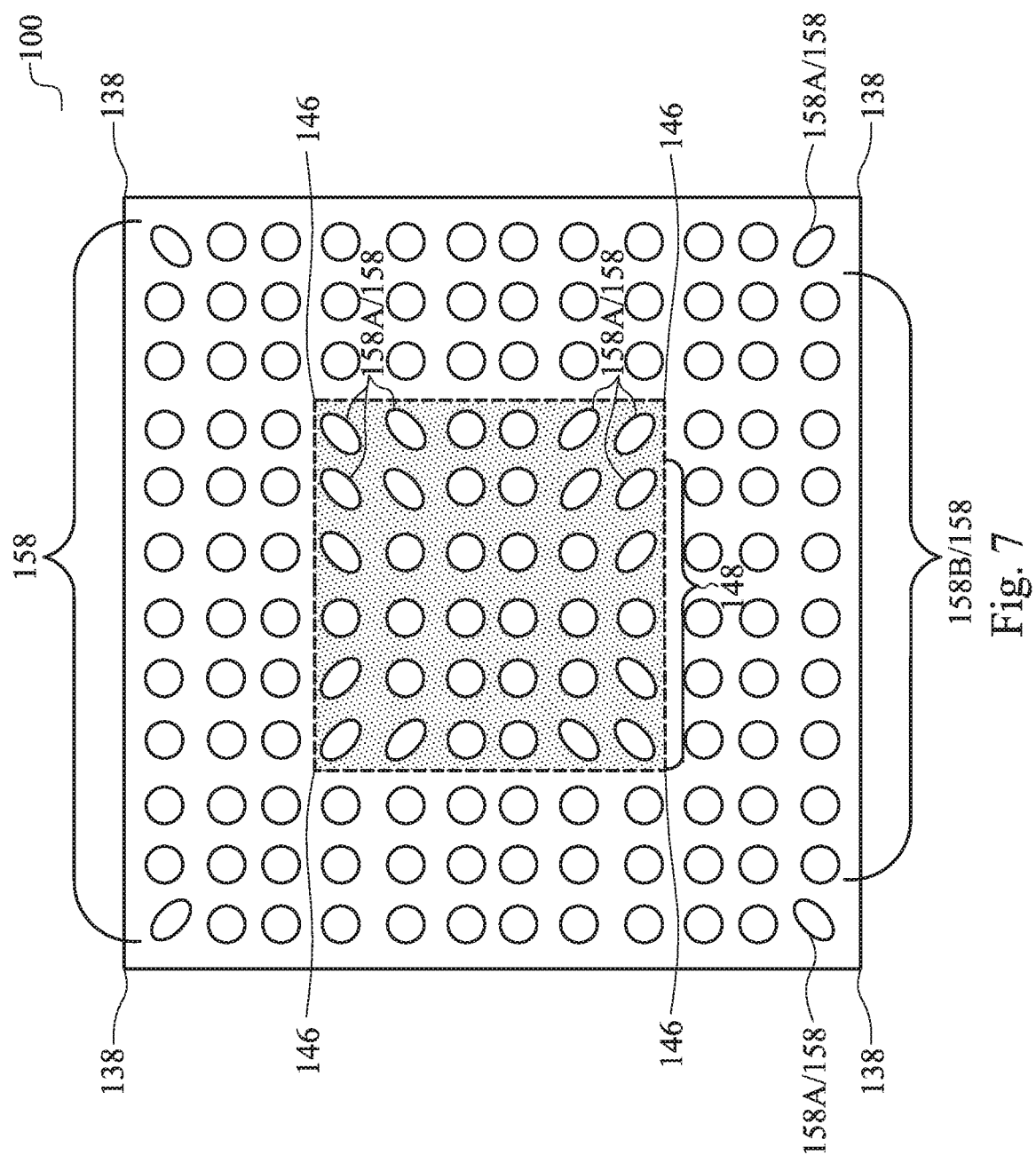
FIG. 7 illustrates the top view of a package and openings in a top dielectric layer of the package in accordance with some embodiments, wherein a plurality of inner openings adjacent to each corner of an underlying device die is elongated.
Figure 8:
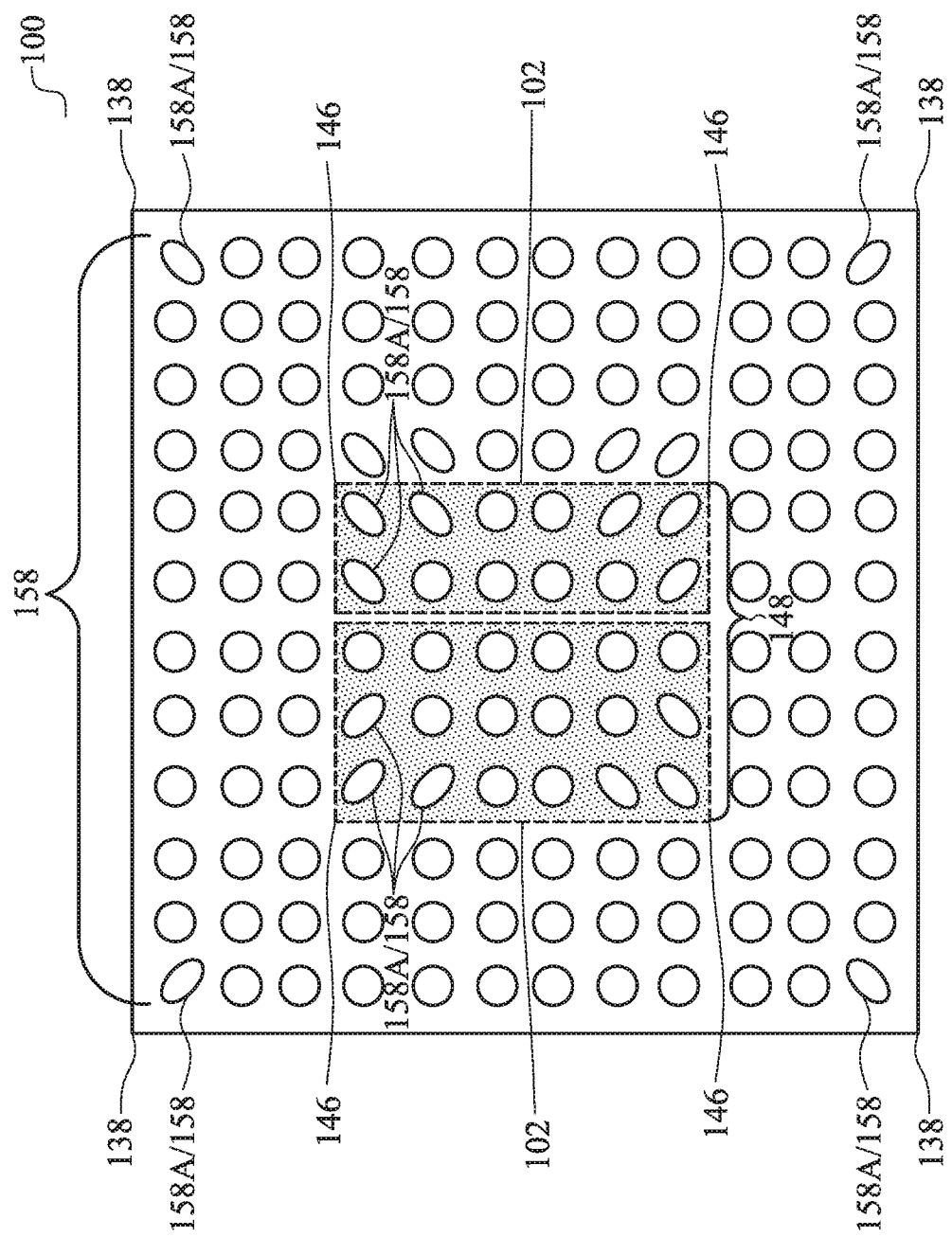
FIG. 8 illustrates the top view of a package and openings in a top dielectric layer of the package in accordance with some embodiments, wherein a plurality of inner openings adjacent to each corner of an underlying device die group is elongated.

FIGS. 7 and 8 illustrate the top views of bottom package 100 and openings 158 in accordance with yet alternative embodiments. These embodiments are similar to the embodiments in FIGS. 5 and 6 except that more openings 158 that are close to the corners 146 of, and overlaps, device dies 102 or device die group 148 are elongated openings 158A, which are surrounded by non-elongated openings 158B. Furthermore, FIG. 7 illustrates a single device die 102, with elongated openings 158A being distributed close to the corners 146 of device die 102. FIG. 8 illustrates a device die group 148, with elongated openings 158A being distributed close to the corners 146 of device die group 148. In accordance with some embodiments in FIGS. 5 through 8, an inner elongated opening 158A may be fully, or partially, overlapped by the overlying device die 102 or device die group 148.

Figure 9:
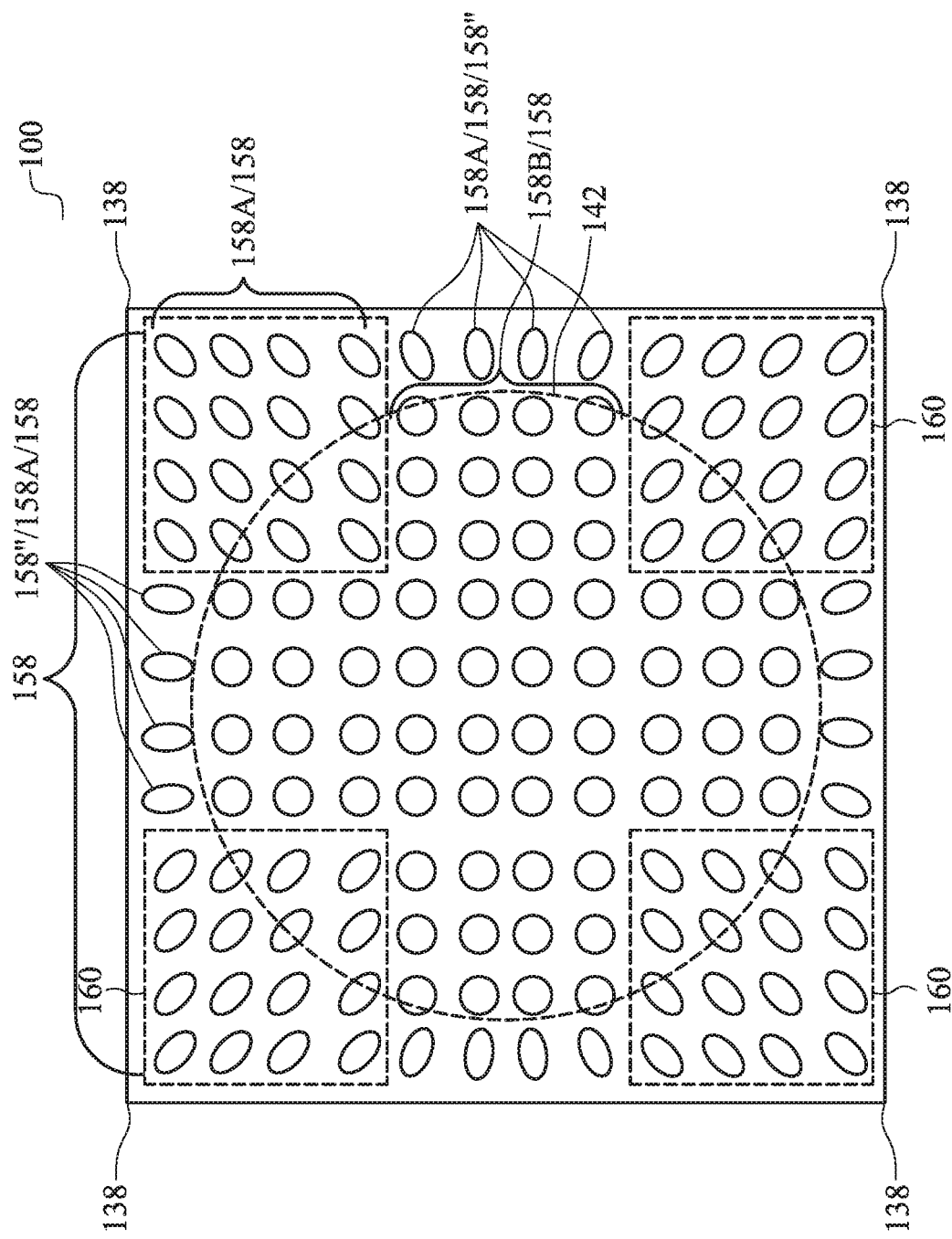
FIG. 9 illustrates the top view of a package and openings in a top dielectric layer of the package in accordance with some embodiments, wherein openings in corner rectangular regions are elongated.

FIG. 9 illustrates the design of openings 158 in accordance with yet alternative embodiments. In these embodiments, four corner regions 160 of bottom package 100 are defined, each extending from one of corners 138 inwardly. The four corner regions 160 may have rectangular shapes and may have sizes the same as each other. The openings 158 inside corner regions 160 are designed as elongated opening 158A. The openings 158 outside corner regions 160 may be designed as non-elongated openings 158B or may be designed as elongated opening 158A.

In some embodiments as in FIG. 9, circle 142 is also drawn according to simulation or experiment results. The radius of circle 142 may be small, and hence some of openings 158 that are outside of corner regions 160 are also outside of circle 142. Accordingly, as shown in FIG. 6, some of openings 158 (marked as 158") that are outside of the circle 142 are also elongated openings 158A, while the openings 158 that are outside of corner regions 160, but inside circle 142, are non-elongated openings 158B.

FIGS. 12A and 12B illustrate the top views of some exemplary elongated openings 158A and the respective metal pad 150 (also refer to FIG. 1) that are underlying and in contact with the elongated openings 158A. In accordance with some embodiments, metal pad 150 has a non-elongated shape such as a circle (as shown in FIG. 12A), a square, a hexagon, an octagon, or the like. In alternative embodiments, as shown in FIG. 12B, metal pad 150 may also have an elongated shape that fits the shape of the respective elongated opening 158A. Furthermore, the long axis of metal pad 150 may be parallel to, and may overlap, the long axis of the respective elongated opening 158A. By designing metal pad 150 to be elongated, the reliability of the respective package may be further improved.

Figure 13:
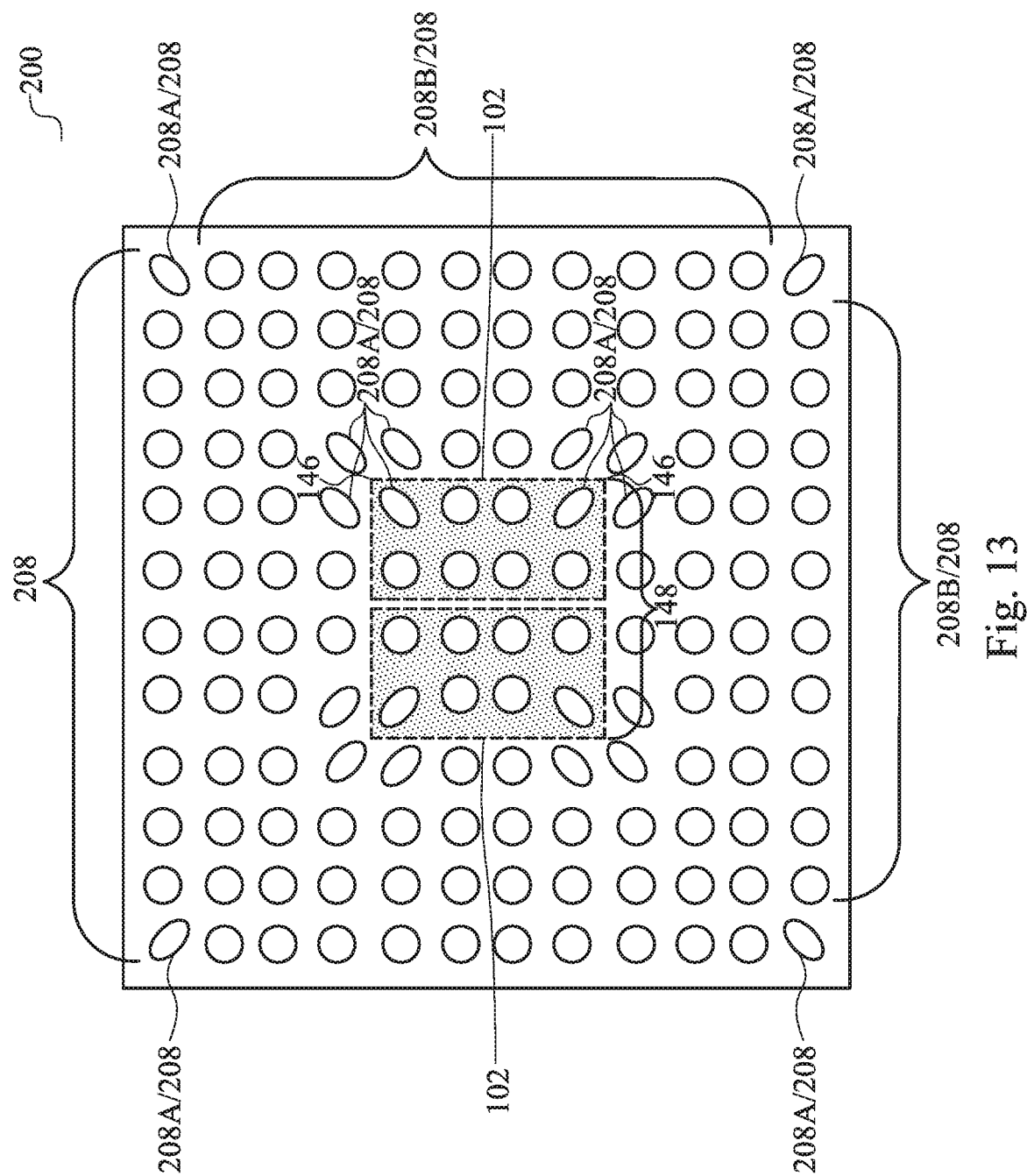
FIG. 13 illustrates the metal pads on a package that is bonded to the package with elongated openings.

In the above-discussed embodiments, openings 158 include elongated openings 158A and non-elongated openings 158B. As shown in FIG. 1, openings 158 (including elongated openings 158A and non-elongated openings 158B) are bonded to metal pads 208 through solder regions 206. To fit the shapes of elongated openings 158A and non-elongated openings 158B, metal pads 208 in package component 200 may also be designed to have elongated metal pads 208A overlapping and bonded to elongated openings 158A and elongated metal pads 208B overlapping and bonded to non-elongated openings 158B. An exemplary bottom view of metal pads 208A and 208B are schematically illustrated in FIG. 13. In accordance with some embodiments of the present disclosure, each of the elongated openings 158A in FIGS. 2 through 9 corresponded to, and are overlapped by and bonded to, the respective overlying elongated metal pads 208A, and each of the non-elongated openings 158B in FIGS. 2 through 9 corresponded to, and are overlapped by, the respective overlying non-elongated metal pads 208B. The bottom shapes of elongated metal pads 208A and non-elongated metal pads 208B and their respective positions are similar to the shape of the corresponding elongated openings 158A and non-elongated openings 158B in FIGS. 2 through 9, and hence are not illustrated.

Throughout the embodiments of the present disclosure, as shown in FIGS. 2 through 9, elongated openings 158A are centripetal. In accordance with some embodiments, the longer axis 134 (FIGS. 10A and 10B) of elongated centripetal openings 158A extend toward the neutral-stress point 140 (FIGS. 2 through 4), which may be at, or at least close to, the center of bottom package 100 (in the top view). Alternatively stated, the longer axis 134 (FIGS. 10A and 10B) of the centripetal elongated openings 158A pass through the center of bottom package 100, or at least, the longer axis 134 of the centripetal elongated openings 158A are closer to the center of bottom package 100 than the respective shorter axis 136.

The embodiments of the present disclosure have some advantageous features. By designing centripetal elongated openings, the solder regions in the centripetal elongated openings can endure higher stresses without failure than the solder regions in non-elongated openings. The locations of the centripetal elongated openings are selected according to the stresses suffered by the solder regions. Simulation results indicated that when the corner openings of the bottom package 100 are centripetal elongated openings, the respective package fails after 769 thermal cycles in the reliability test. In comparison, when the corner openings of the bottom package 100 are non-elongated openings, the respective package fails after 604 thermal cycles. When the corner openings of the bottom package 100 are elongated openings with the widthwise directions extending toward the neutral-stress point, the respective bottom package fails after 574 thermal cycles. These results indicate that a package with centripetal elongated openings have improved reliability and can endure more thermal circles before they fail.

FIGS. 14 through 26 illustrate cross-sectional views and top views of intermediate stages in the formation of packages in accordance with alternative embodiments of the present disclosure. Unless specified otherwise, the materials and the formation methods of the components in these embodiments are essentially the same as the like components, which are denoted by like reference numerals in the embodiments shown in FIGS. 1 through 13. The details regarding the formation process and the materials of the components shown in FIGS. 14 through 26 may thus be found in the discussion of the embodiments shown in FIGS. 1 through 13.

Figure 14:
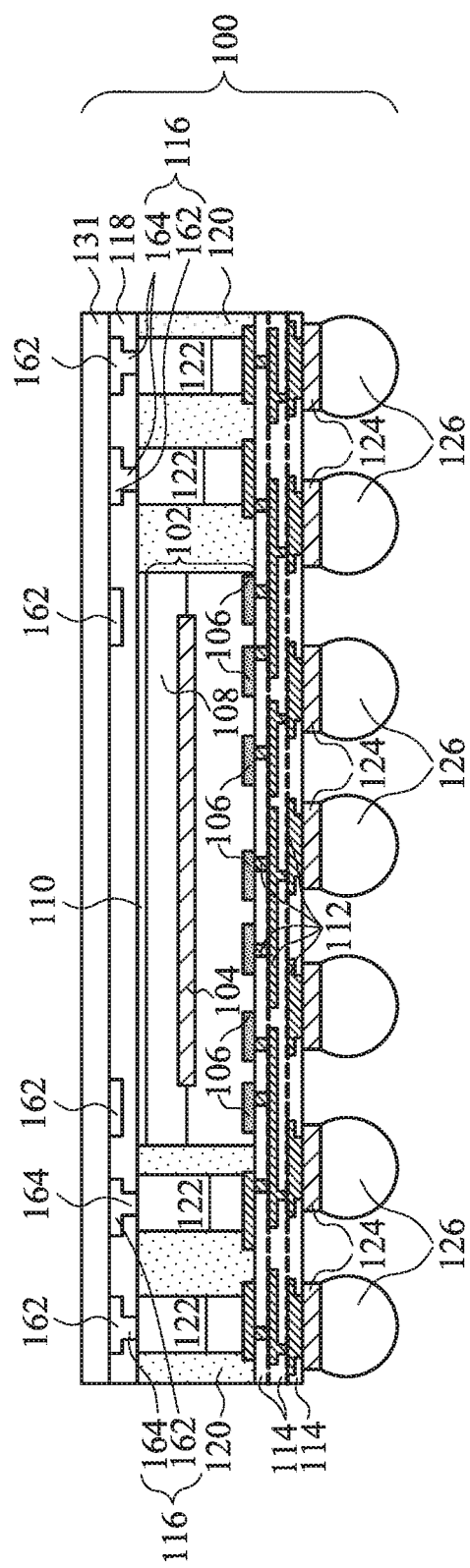

Referring to FIG. 14, bottom package 100 is formed. The majority of bottom package 100 is similar to what is shown in FIG. 1, and the details of these parts are not described. Backside RDLs 116 are formed on the back side of device die 102. In accordance with some embodiments of the present disclosure, there is one device die 102 in bottom package 100, as illustrated in FIG. 14. In accordance with alternative embodiments of the present disclosure, there are two or more device dies in bottom package 100, similar to what is shown in FIG. 1. Furthermore, although one layer of RDLs 116 is illustrated, there may be two or more layers of RDLs on the backside of device die 102, depending on the routing requirement of the respective package. RDLs 116 are formed in dielectric layer(s) 118. In accordance with some embodiments of the present disclosure, dielectric layer 118 is formed of an organic material such as a polymer, which may include PBO, polyimide, BCB, or the like. In accordance with alternative embodiments of the present disclosure, dielectric layer 118 is formed of an inorganic dielectric material such as silicon oxide, silicon nitride, silicon oxynitride, multi-layers thereof, or combinations thereof.

Backside RDLs 116 include conductive lines and pads 162 (collectively referred to as lines/pads 162 hereinafter), and vias 164 electrically connecting conductive lines/pads 162 to through-vias 122. In accordance with some embodiments, all top surfaces of conductive lines/pads 162 are planar, and are coplanar with the top surface of dielectric layer 118. In accordance with alternative embodiments, each of bonding pads 162 has a recessed center portion (not shown), and edges portions higher than the recessed center portion. Conductive lines/pads 162 may be formed of aluminum, nickel, titanium, aluminum copper, or the like. Throughout the description, bonding pads 162 are alternatively referred to as bonding features.

As also shown in FIG. 14, dielectric layer 131 is formed. The bottom surface of dielectric layer 131 is in contact with the top surfaces of dielectric layer 118 and conductive lines/pads 162. In accordance with some exemplary embodiments of the present disclosure, dielectric layer 131 is formed of a polymer, and hence is referred to as polymer layer 131 throughout the description. It is appreciated that dielectric layer 131 may also be formed of a non-polymer material. The exemplary candidate materials for forming polymer layer 131 include, but are not limited to, PBO, BCB, polyimide, and the like. In accordance with some embodiments, both dielectric layers 118 and 131 are formed of PBO.

Figure 15:
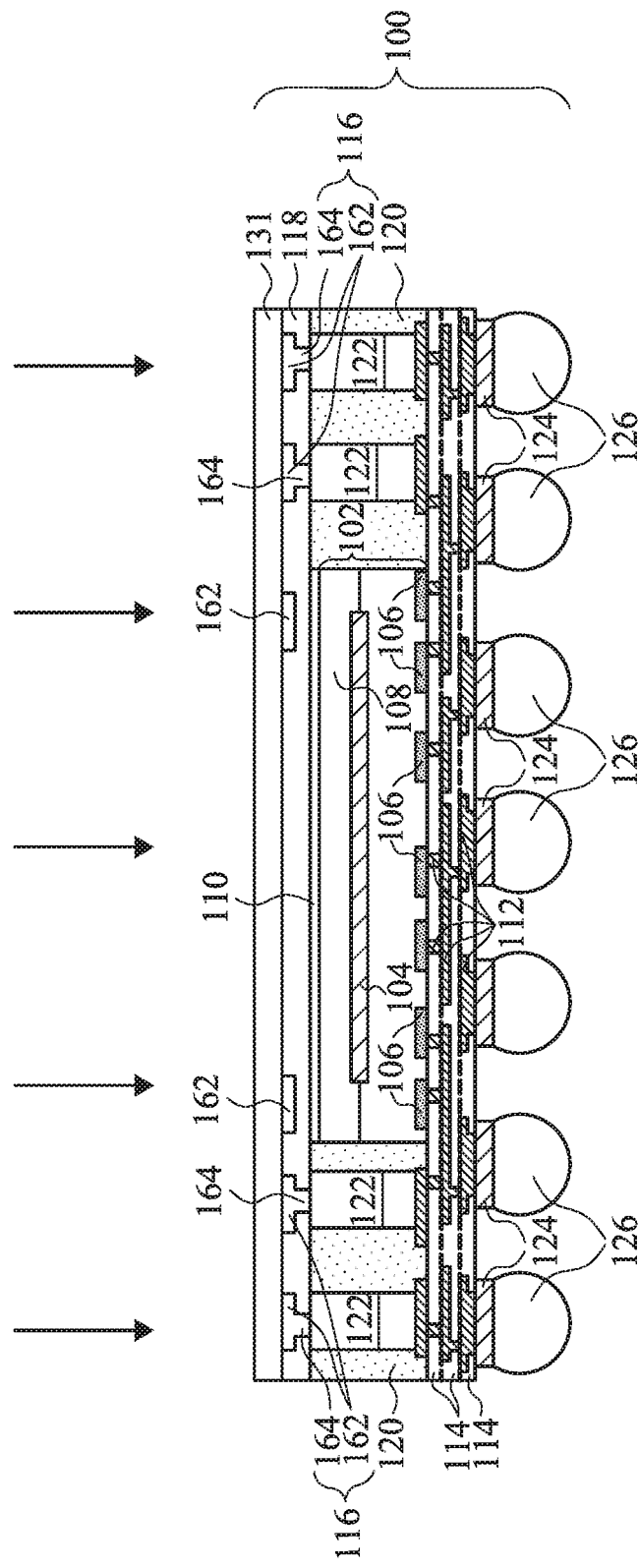

Referring to FIG. 15, an etching step is performed to remove dielectric layer 131, wherein the etching is illustrated using arrows. In accordance with some embodiments of the present disclosure, the etching is isotropic, and may be performed using dry etching or wet etching. In the embodiments wherein dielectric layers 118 and 131 are formed of PBO, the etching may be performed in a dry etching process, with the gases used for the dry etching including nitrogen ($N_2$), argon (Ar), and oxygen ($O_2$). In accordance with alternative embodiments, a CMP is performed to remove dielectric layer 131.

Figure 16:
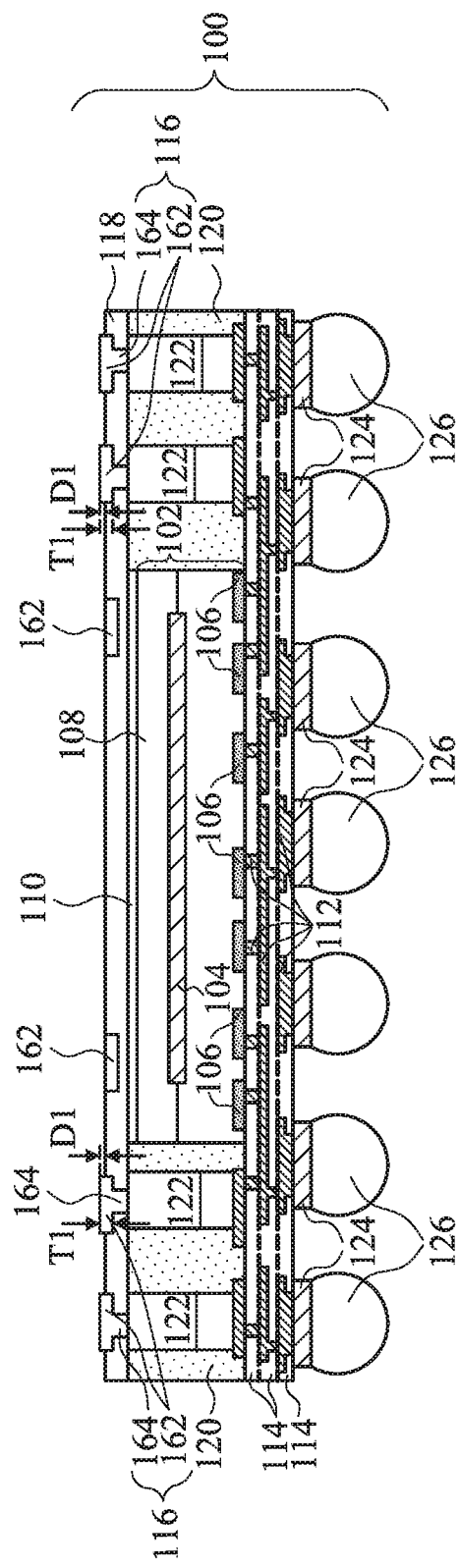

FIG. 16 illustrates the bottom package 100 after the etching. In the etching process, dielectric layer 131 (FIG. 15) is removed, and conductive lines/pads 162 are exposed. Furthermore, the etching process is controlled to have an over-etching, so that the top portion of dielectric layer 118 is also etched, and the bottom portion of dielectric layer 118 is not etched. Accordingly, dielectric layer 118 is recessed. Recessing depth D1 may be in the range between about ⅓ and about ½ of thickness T1 of conductive lines/pads 162. The recessing of dielectric layer 118 ensures the exposure of conductive lines/pads 162. Furthermore, with the recessing of dielectric layer 118, the sidewalls of bonding pads 162 are exposed, and hence the reliability of the subsequent bonding process is improved.

Figure 17:
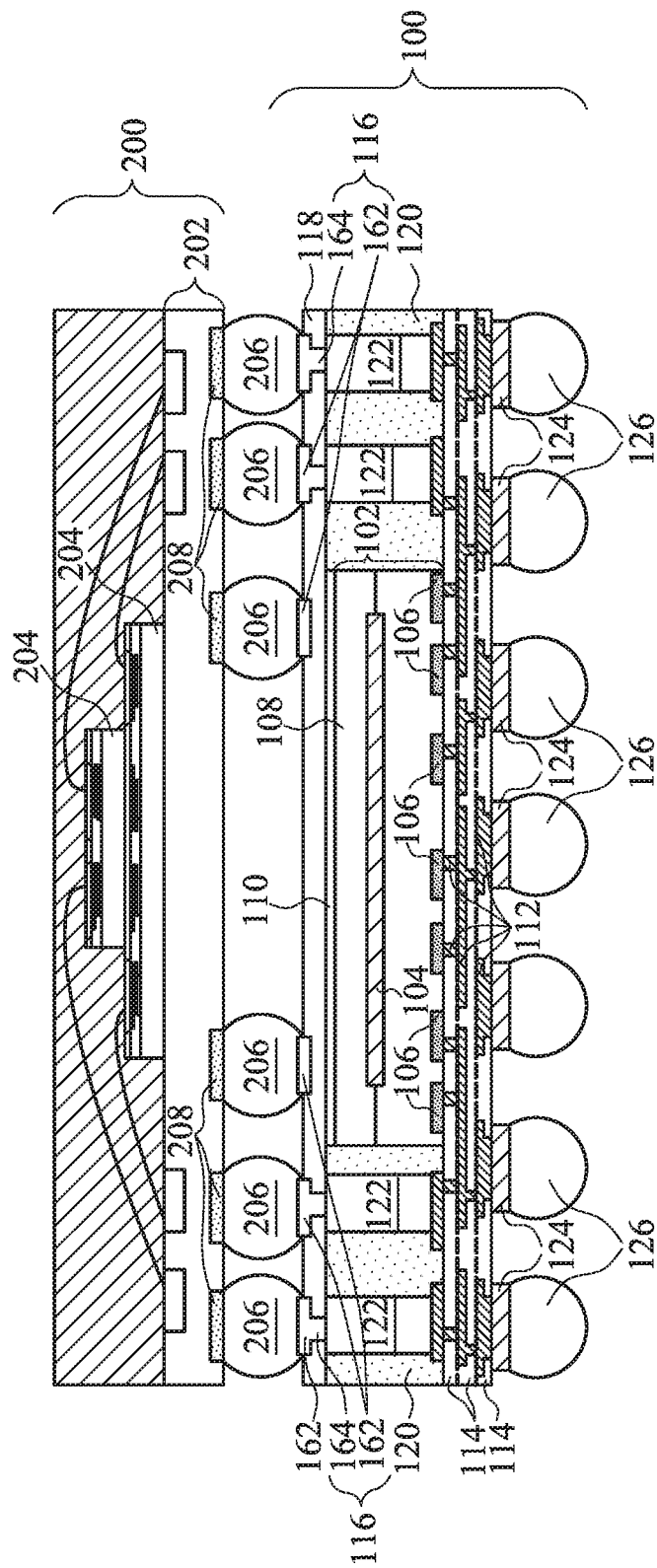

Next, referring to FIG. 17, package 100 is bonded with package 200. In accordance with some embodiments of the present disclosure, the bonding is performed through solder regions 206, which join bonding pads 162 to metal pads 208 in the overlying package 200. In some embodiments, package 200 includes device dies 204, which may be memory dies such as Static Random Access Memory (SRAM) dies, Dynamic Random Access Memory (DRAM) dies, or the like. Memory dies 204 may also be bonded to package substrate 202 in some exemplary embodiments.

Due to the recessing of dielectric layer 118, solder regions 206 are also in contact with the sidewalls of bonding pads 162. The interface between solder region 206 and the sidewall of some of bonding pads 162 may form full rings. Advantageously, with solder regions 206 contacting the sidewalls of bonding pads 162, the contact areas between bonding pads 162 and solder regions 206 are increased, and hence the contact resistance is reduced. Furthermore, the bonding strength is improved.

Figure 18A:
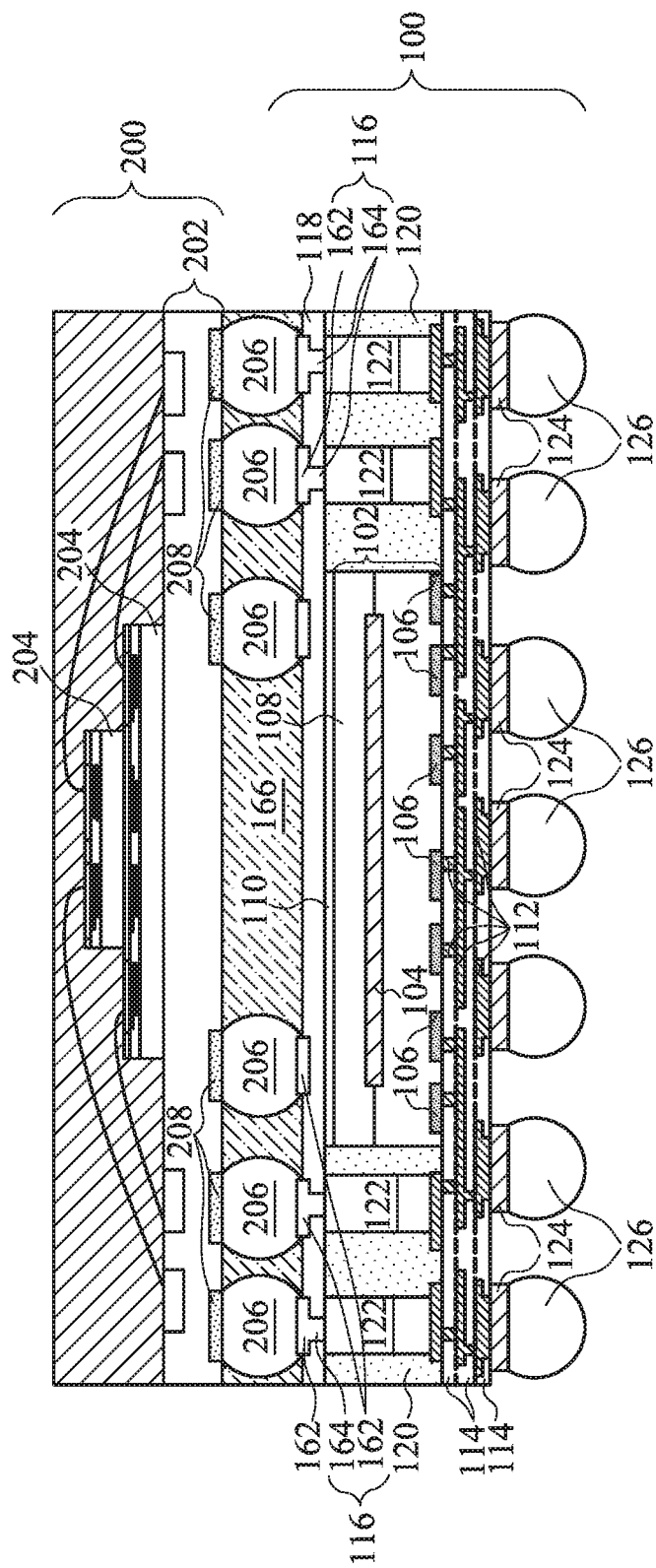

FIG. 18A illustrates the dispensing of underfill 166 between packages 100 and 200. Underfill 166 encircles solder regions 206. Underfill 166 is dispensed in a liquid state, and is then cured, for example, in a thermal process. In accordance with some embodiments of the present disclosure, the bottom surface of underfill 166 is in contact with the top surface of dielectric layer 118. Furthermore, the bottom surface of underfill 166 is lower than the top surfaces of bonding pads 162 in the embodiments in which dielectric layer 118 is recessed. The top surface of underfill 166 is in contact with the bottom surface of package 200. The entirety of underfill 166 may be formed of a homogenous material.

Figure 18B:
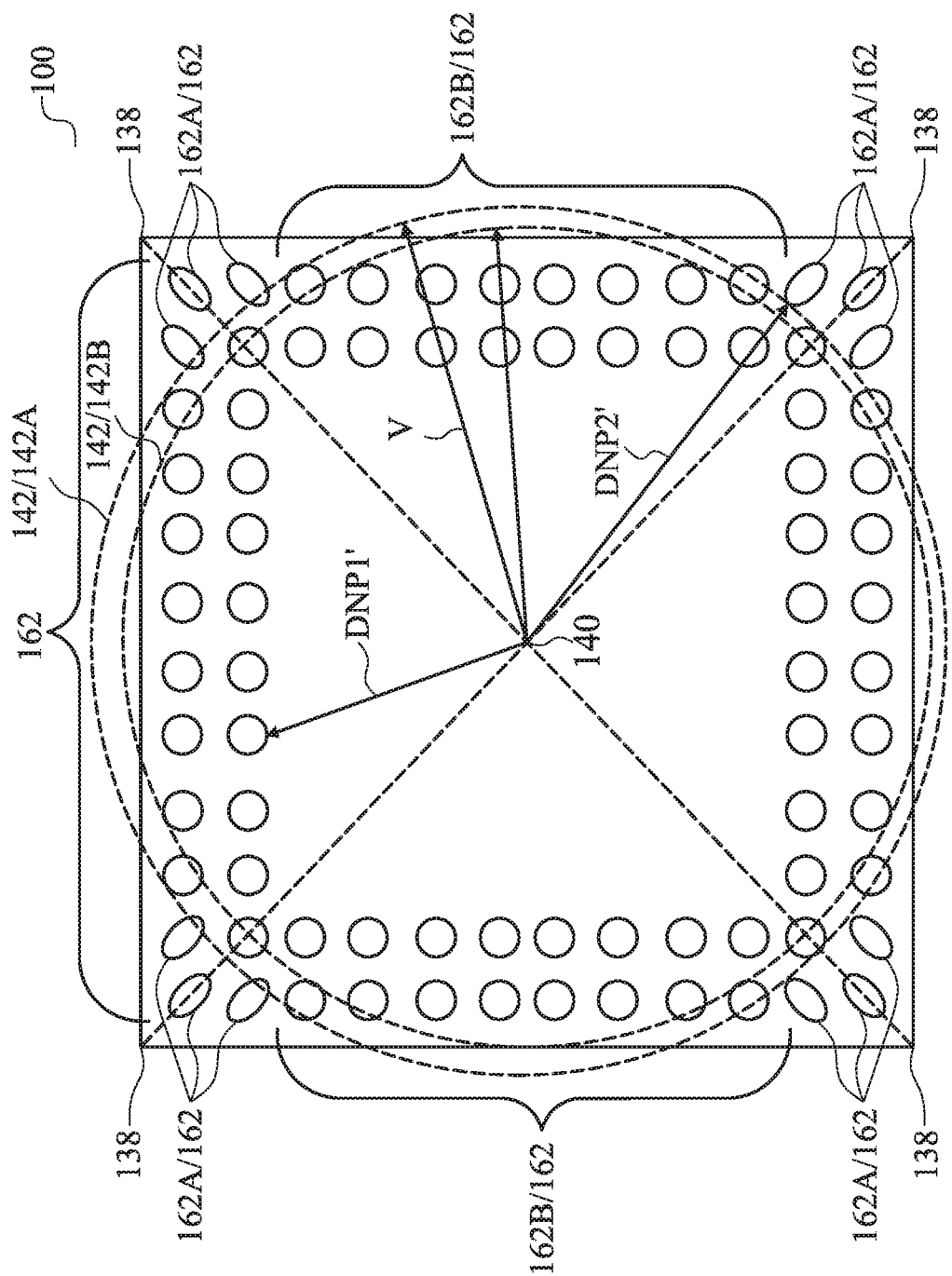

FIG. 18B illustrates a schematic top view of some portions of bottom package 100, wherein bonding pads 162 are illustrated. Bonding pads 162 include elongated bonding pads 162A and non-elongated bonding pads 162B. In the following figures, circles are used to schematically represent non-elongated bonding pads 162B, and ovals are used to schematically represent elongated bonding pads 162A.

Figure 19A:
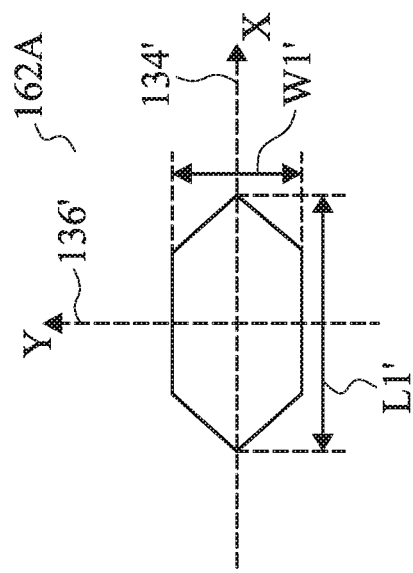
FIGS. 19A and 19B illustrate the top views of some exemplary elongated bonding pads in accordance with some embodiments.
Figure 19B:
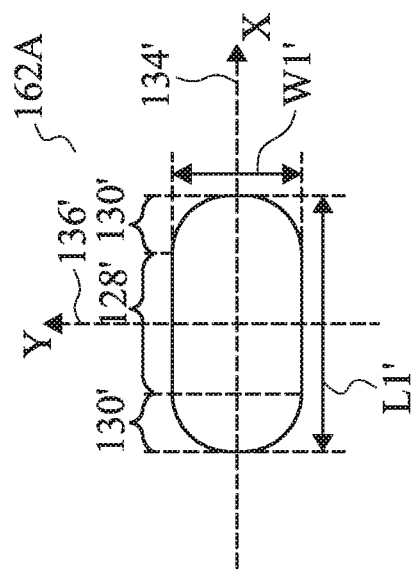

FIGS. 19A and 19B illustrate the top views of some exemplary elongated bonding pads 162A. In each of FIGS. 19A and 19B, elongated bonding pad 162A has length L1' measured in lengthwise direction X and width W1' measured in widthwise direction Y, which is perpendicular to lengthwise direction X. Length L1' is greater than width W1'. Elongated bonding pad 162A includes longer axis 134' in lengthwise direction X and shorter axis 136' in widthwise direction Y. Throughout the description, an elongated bonding pad 162A is a pad whose length-to-width ratio L1'/W1' is greater than threshold ratio Lt, which may be greater than about 1.2, 1.6, or 2.0.

Elongated bonding pad 162A may have various shapes including, but not limited to, an oval shape, a rectangular shape, an elongated octagonal shape, or the like. For example, FIG. 19A illustrates an exemplary elongated bonding pad 162A, which includes two half circles 130' connected to opposite edges of rectangle 128'. FIG. 19B illustrates an exemplary elongated bonding pad 162A with a hexagon shape. It is appreciated that other elongated shapes other than what have been discussed may also be used.

Figure 20A:
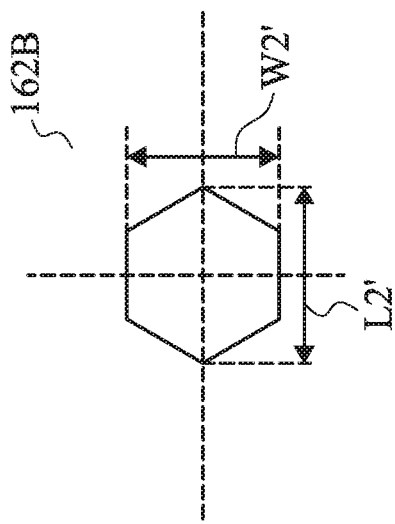
FIGS. 20A and 20B illustrate top views of some exemplary non-elongated bonding pads in accordance with some embodiments.
Figure 20B:
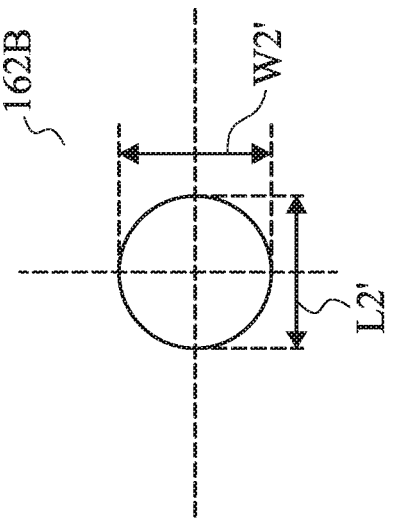

FIGS. 20A and 20B illustrate the top views of exemplary non-elongated bonding pads 162B. Throughout the description, a non-elongated bonding pad 162B does not have length L2' and width W2' significantly different from each other. Alternatively, a non-elongated bonding pad 162B has width W2' smaller than length L2', with length-to-width ratio L2'/W2' being smaller than the threshold ratio Lt, which may be smaller than about 1.2 or about 1.1 in accordance with some exemplary embodiments. For example, FIGS. 20A and 20B illustrate non-elongated bonding pads 162B, which have a circular bottom-view shape and a hexagonal bottom-view shape, respectively. In the same package 100, length-to-width ratio L1'/W1' of elongated bonding pads 162A is greater than length-to-width ratio L2/W2 of non-elongated bonding pads 162B.

Although not shown in FIGS. 19A, 19B, 20A, and 20B, the top views of solder regions 206 (FIG. 20) are defined by bonding pads 162. Hence, solder regions 206 may also include elongated solder regions (in the top view of package component 100) and non-elongated solder regions.

Referring back to FIG. 18B, bottom package 100 includes four corners 138. The corner bonding pads 162, which are closer to the respective corners 138 than all other bonding pads, are elongated bonding pads 162A. Other bonding pads 162 that are farther away from the respective corners 138 than the corner bonding pads 162A may be non-elongated bonding pads 162B. In accordance with some embodiments of the present disclosure, there may be more than one elongated bonding pad 162A at each corner 138. For example, as shown in FIG. 18B, there are three elongated bonding pads 162A at each corner 138. In accordance with alternative embodiments, there is a single elongated bonding pad 162A at each corner 138, while other bonding pads are non-elongated.

Whether a bonding pad 162 should be designed as elongated or non-elongated is related to its distance from the neutral-stress point of package 100 in accordance with some embodiments of the present disclosure. As shown in FIG. 18B, in the top view, bottom package 100 has neutral-stress point 140, which is the point substantially free from the stresses applied from any lateral direction that is parallel to the bottom surface of package 100. At neutral-stress point 140, the lateral stresses from opposite directions are cancelled out. The lateral stresses are the stresses parallel to the top and bottom surfaces of package component 100 in FIG. 18A. In accordance with some embodiments of the present disclosure, neutral-stress point 140 is at or close to the center of bottom package 100 (in the top view). The distance between each of bonding pads 162 and neutral-stress point 140 is referred to as a DNP of the respective bonding pad 162, wherein the distance of a bonding pad 162 is measured from a point of the bonding pad 162 that is closest to neutral-stress point 140. For example, DNPs DNP1' and DNP2' are illustrated as examples in FIG. 18B.

As shown in FIG. 18B, a circle 142 (such as 142A) may be drawn with neutral-stress point 140 as the center, wherein circle 142 has radius r. In accordance with the embodiments of the present disclosure, all bonding pads 162 with DNPs equal to or smaller than radius r are designed as non-elongated bonding pads 162B, and all bonding pads 162 with DNPs greater than radius r are designed to be elongated bonding pads 162A. If radius r is large, then the elongated conductive pads include four corner pads but not other bonding pads. When radius r is chosen to be smaller (as shown by a smaller ring 142B), more bonding pads 162 are designed to be elongated.

The selection of the appropriate radius r is related to the stress level of solder regions 206, and with the appropriate radius r selected, no solder regions 206 should have cracking caused by the stress. Radius r may also be based on the measurement results from packages and/or simulation results. In accordance with some embodiments, radius r is selected by ensuring the stresses suffered by all solder regions 206 and bonding pads 162 in circle 142 to be lower than a pre-determined threshold stress, while the stresses suffered by at least some solder regions 206 and bonding pads 162 outside circle 142 are higher than the threshold stress.

In accordance with some embodiments of the present disclosure, bonding pads 162 are distributed close to the peripheral regions of package 100, and not in the inner regions, as shown in FIG. 18B. In accordance with alternative embodiments, bonding pads 162 are distributed as an array that expands throughout package 100, as shown in FIG. 18C.

As shown in FIGS. 18B and 18C, elongated bonding pads 162A are centripetal, wherein the lengthwise directions of elongated bonding pads 162A extend toward center (neutral-stress point) 140 of package 100. In accordance with some embodiments, the lengthwise directions (X directions in FIGS. 19A and 19B) of elongated bonding pads 162A may pass through center 140 of package 100.

It is realized that the amount of solder needed by solder regions 206 is related to the top-view areas of bonding pads 162. The heights of solder regions 206 are related to the areas of bonding pads 162, and the greater the areas of bonding pads 162, the lower the heights of solder regions 206 will be. Since the volumes of solder regions 206 are likely to be the same as each other, the solder regions 206 formed on large bonding pads 162 are more likely to have lower heights, and are more likely to have inferior contact with bonding pads 162 and/or metal pads 208. To avoid this problem, elongated bonding pads 162A and non-elongated bonding pads 162B are designed to have the same area (the top-view area in FIG. 18A). Accordingly, length L1' of elongated bonding pads 162A (FIG. 19A and 19B) is greater than length L2' of non-elongated bonding pads 162B (FIG. 20A or 20B), and width W1' of elongated bonding pads 162A (FIG. 19A or 19B) is smaller than width W2' of non-elongated bonding pads 162B (FIG. 20A or 20B).

FIGS. 21 through 25 illustrate the cross-sectional views of intermediate stages in the formation of a package in accordance with alternative embodiments. These embodiments are similar to the embodiments in FIGS. 14 through 18C, except that no backside RDLs are formed in these embodiments, and solder regions are bonded directly to through-vias.

Figure 21:
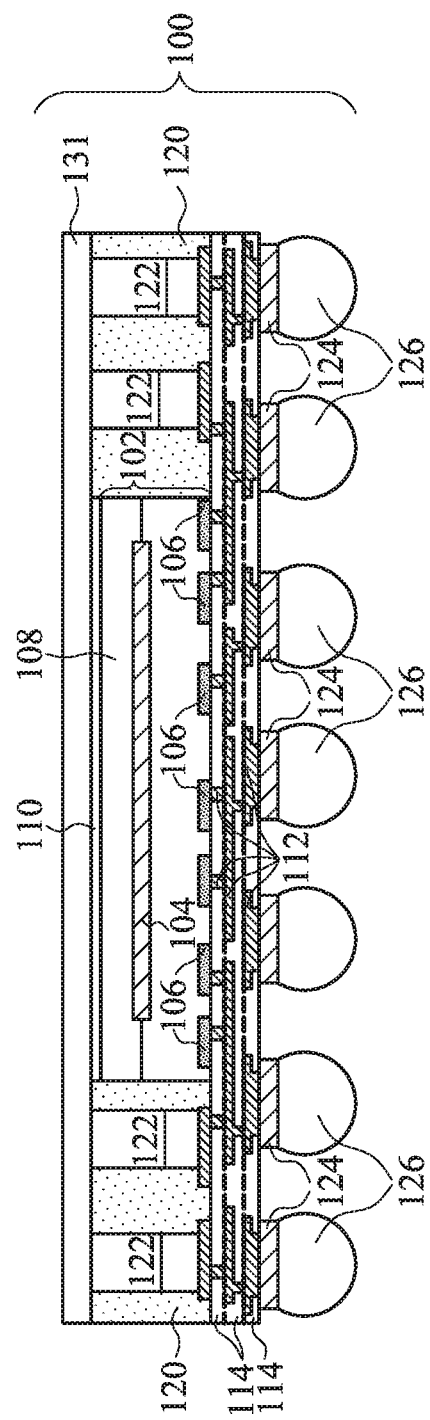
FIGS. 21 through 25 illustrate the cross-sectional views of intermediate stages in the formation of a package in accordance with some embodiments.

Referring to FIG. 21, bottom package 100 is formed. In accordance with these embodiments of the present disclosure, through-vias 122, die-attach film 110, and molding material 120 have top surfaces coplanar with each other. Dielectric layer 131 is formed to cover through-vias 122, die-attach film 110, and molding material 120. Furthermore, dielectric layer 131 may be in physical contact with the top surfaces of through-vias 122, die-attach film 110, and molding material 120. The material of dielectric layer 131 may be selected from the same candidate materials for forming dielectric layer 131 in FIG. 14. In accordance with some embodiments, dielectric layer 131 is formed of PBO.

Figure 22:
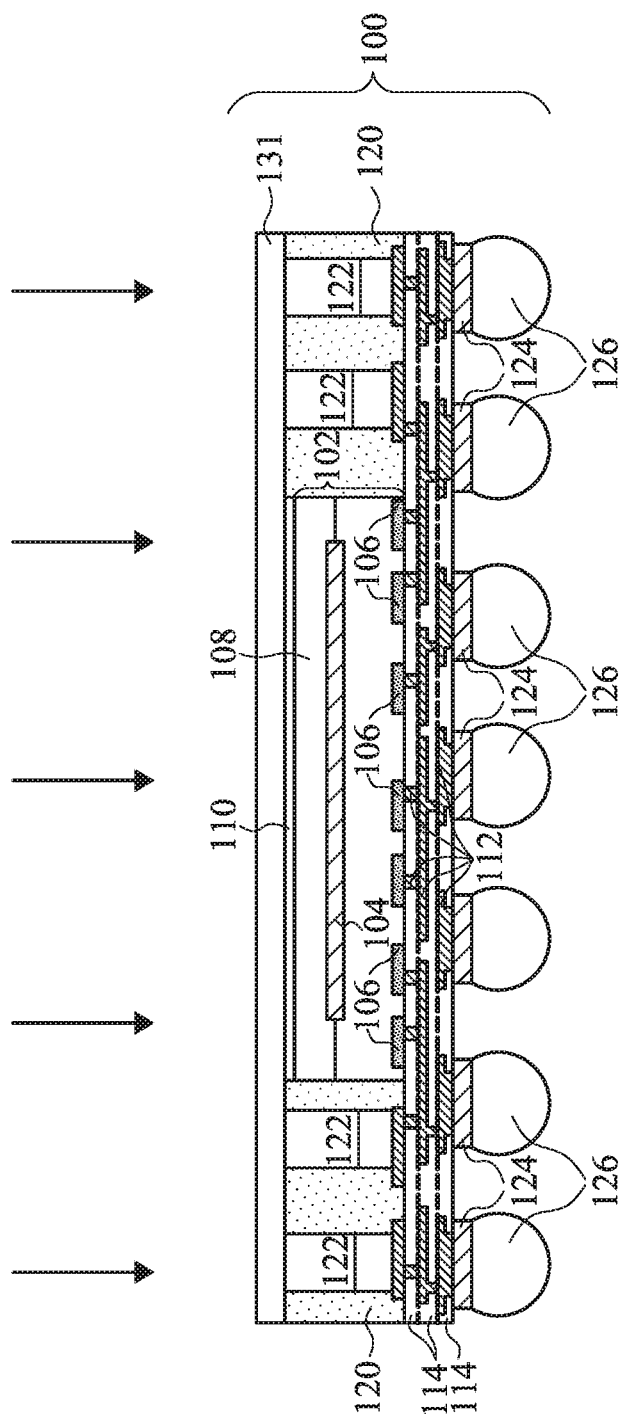

Referring to FIG. 22, an etching step is performed to remove dielectric layer 131, wherein the etching is illustrated using arrows. In accordance with some embodiments of the present disclosure, the etching is isotropic, and may be performed using dry etching or wet etching. In accordance with alternative embodiments, a CMP is performed to remove dielectric layer 131. In the embodiments in which dielectric layer 131 is formed of PBO, the etching may include a dry etching process, with the gases used for the dry etching including nitrogen ($N_2$), argon (Ar), and oxygen ($O_2$).

Figure 23:
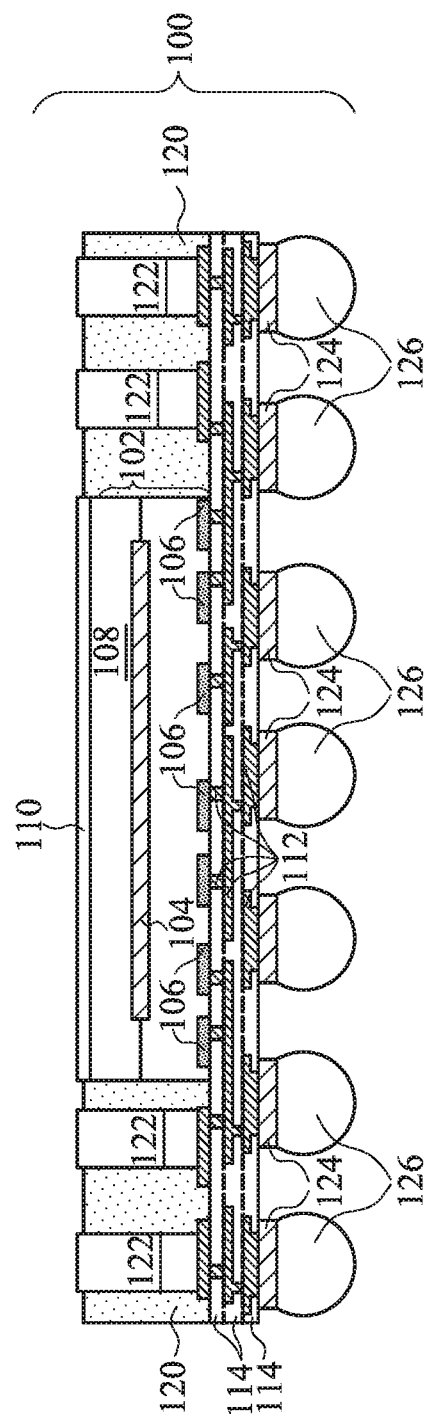

FIG. 23 illustrates the bottom package 100 after the etching. In the etching process, dielectric layer 131 (FIG. 15) is removed, and through-vias 122 are exposed. Throughout the description, through-vias 122 are alternatively referred to as bonding features. Furthermore, the etching process is controlled to have an over-etching, so that the top portion of molding material 120 is also recessed. The recessing of molding material 120 ensures the exposure of the top portions of sidewalls of through-vias 122, and hence the reliability of the subsequently performed bonding process is improved. As a result of the recessing of molding material 120, the sidewalls of die-attach film 110 may also be exposed.

Figure 24:
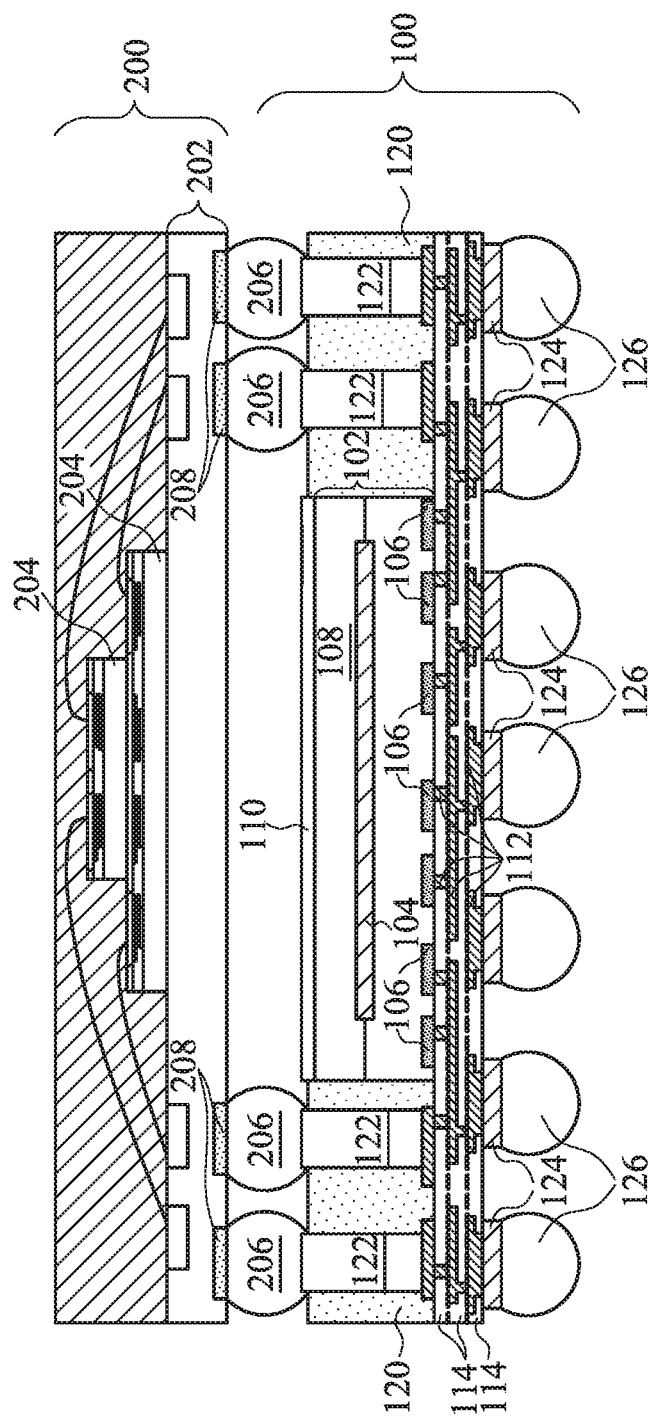

Next, referring to FIG. 24, package 100 is bonded with package 200. In accordance with some embodiments, the bonding is performed through solder regions 206, which join through-vias 122 to metal pads 208 in the overlying package 200. Due to the recessing of molding material 120 and the exposure of the sidewalls of through-vias 122, solder regions 206 are also in contact with the sidewalls of through-vias 122, resulting in the increase in the contact area between through-vias 122 and solder regions 206. Accordingly, the contact resistance is reduced. Furthermore, the bonding strength is improved.

Figure 25:
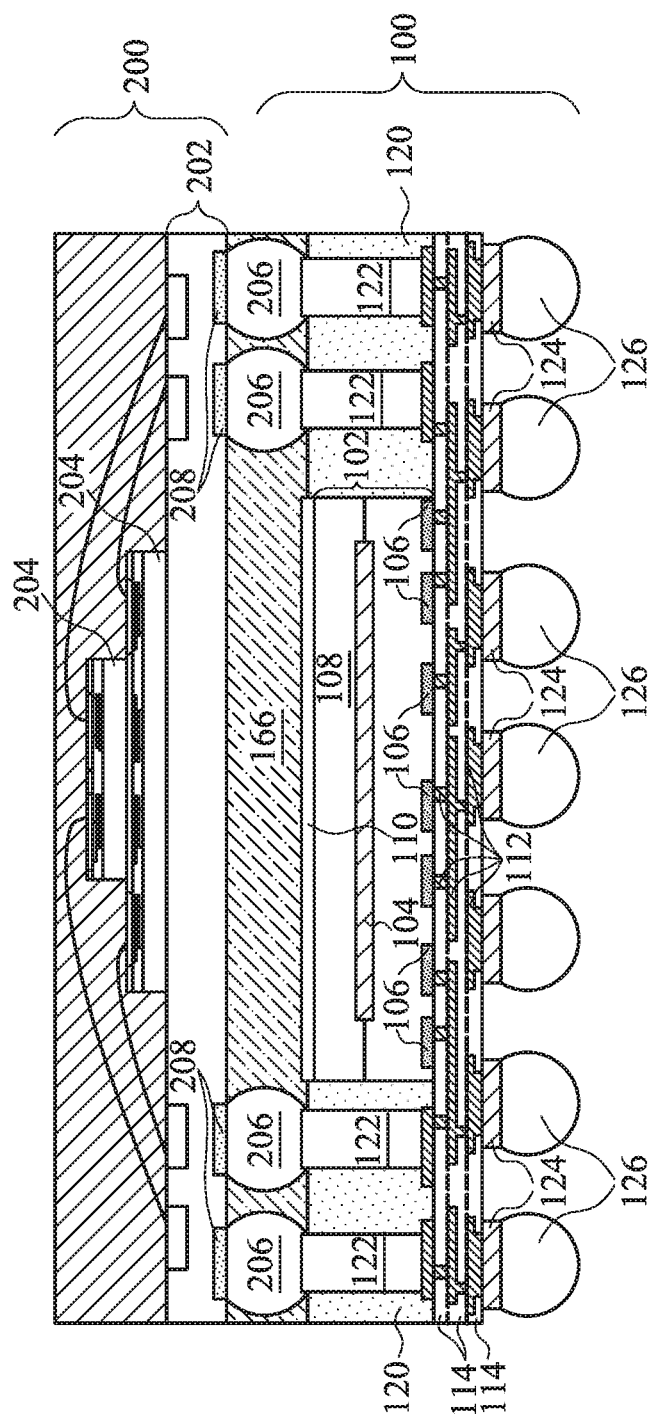

FIG. 25 illustrates the dispensing of underfill 166, which encircles solder regions 206. In accordance with some embodiments of the present disclosure, the bottom surface of underfill 166 is in contact with the top surface of die-attach film 110 and molding material 120. Underfill 166 is further in contact with the sidewalls of die-attach film 110. Furthermore, the bottom surface of underfill 166 is lower than the top surfaces of through-vias 122 in the embodiments in which molding material 120 is recessed. The top surface of underfill 166 is in contact with the bottom surface of package 200. The entirety of underfill 166 may be formed of a homogenous material.

Figure 26:
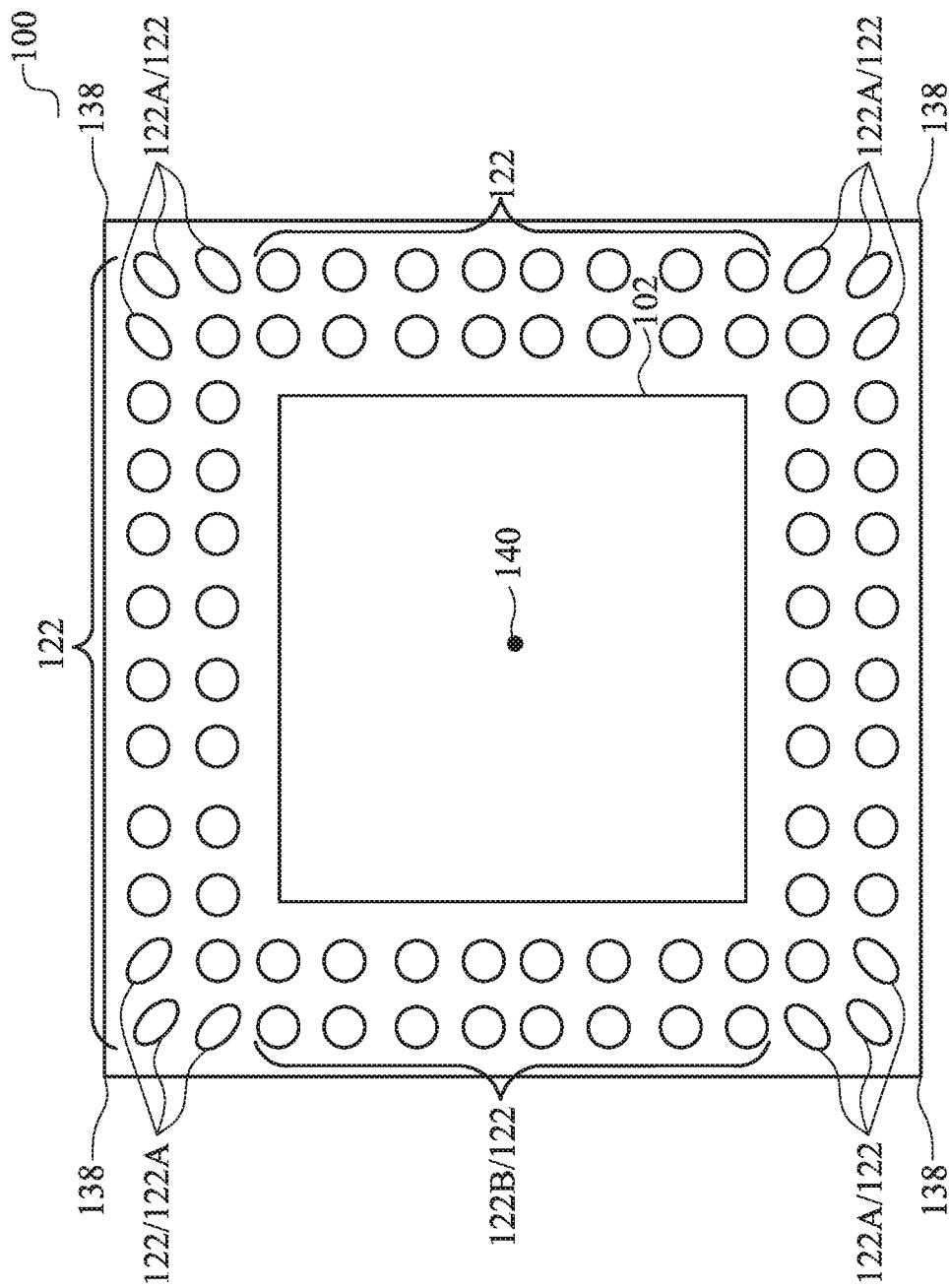
FIG. 26 illustrates the top view of a portion of a package in accordance with some embodiments.

FIG. 26 illustrates a schematic top view of some portions of bottom package 100, wherein through-vias 122 are illustrated. Similar to bonding pads 162, through-vias 122 include elongated through-vias 122A and non-elongated through-vias 122B, as viewed in the top views or bottom views of package 100. Elongated through-vias 122A are also centripetal, with the respective lengthwise directions pointing to neutral stress point 140. Again, circles are used to schematically represent non-elongated through-vias 122B, and ovals are used to schematically represent elongated through-vias 122A. The distinction between elongated through-vias 122A and non-elongated through-vias 122B is similar to the distinction of elongated bonding pads 162A and non-elongated bonding pads 162B, as shown in FIGS. 19A, 19B, 20A, and 20B. For example, in the same package 100, length-to-width ratio L1'/W1' of elongated through-vias 122A is greater than length-to-width ratio L2'/W2' of non-elongated through-vias 122B.

The placement of elongated through-vias 122A and non-elongated through-vias 122B may also be similar to the placement of elongated bonding pads 162A and non-elongated bonding pads 162B. For example, as shown in FIG. 26, bottom package 100 includes four corners 138. The corner through-vias 122, which are closer to the respective corners 138 than all other through-vias 122, are elongated through-vias 122A. Other through-vias 122 that are farther away from the respective corners 138 than the corner through-vias 122A may be non-elongated through-vias 122B. In accordance with some embodiments of the present disclosure, there may be more than one elongated through-via 122A at each corner 138. For example, as shown in FIG. 26, there are three elongated through-vias 122A at each corner 138. In accordance with alternative embodiments, there is a single elongated through-via 122A at each corner 138, while other through-vias are non-elongated. In yet alternative embodiments, whether a through-via is designed as elongate or not is based on its DNP, similar to the design of bonding pads 162 in FIG. 18B, and more or fewer elongated through-vias 122A may be designed depending on the stress level in package 100.

Figure 27B:
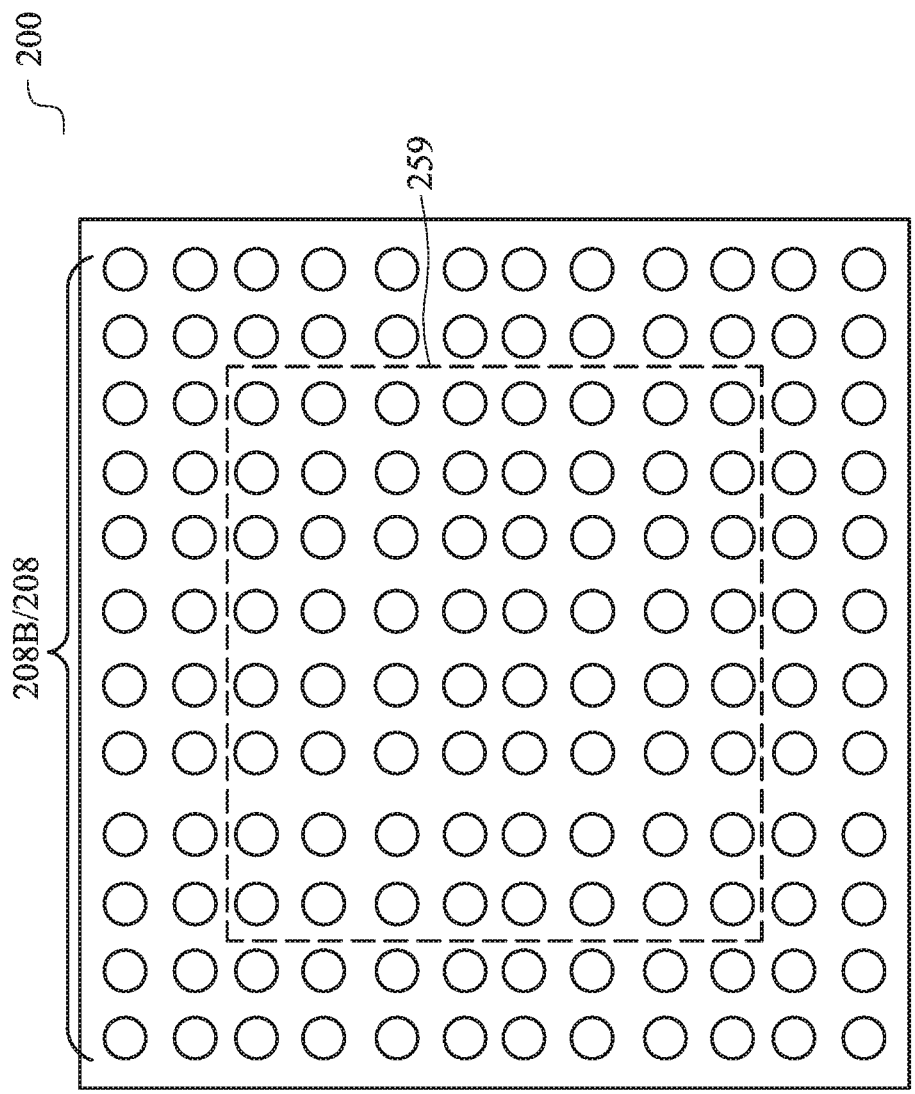

FIGS. 27A and 27B illustrate the bottom views of metal pads 208 (FIG. 25) in package 200 in accordance with some embodiments. Metal pads 208 may include elongated metal pads 208A and non-elongated metal pads 208B. Elongated metal pads 208A are centripetal, with the respective lengthwise directions pointing to neutral-stress point 240 of package 200. Referring to FIG. 27A, in accordance with some embodiments of the present disclosure, each of metal pads 208A is joined to the same solder region 206 as the respective underlying elongated bonding pad 162A (or elongated through-vias 122A, referring to FIG. 18B, 18C, or 25), and vice versa. Each of non-elongated metal pads 208B may be joined to the same solder region 206 as the respective underlying non-elongated bonding pad 162B (or non-elongated through-vias 122B, referring to FIG. 18B, 18C, or 25), and vice versa.

Referring to FIG. 27B, in accordance with alternative embodiments of the present disclosure, all metal pads 208 are non-elongated, and may have the same bottom-view shape and size. As a result, elongated bonding pads 162A (or elongated through-vias 122A) and non-elongated bonding pads 162B (or non-elongated through-vias 122B) are all connect to (through solder regions 206) non-elongated metal pads 208B. In FIGS. 27A and 27B, there are metal pads 208 disposed inside rectangles 259. In accordance with alternative embodiments, there is no metal pad 208 disposed inside rectangles 259.

The embodiments of the present disclosure have some advantageous features. By designing centripetal elongated bonding pads or through-vias, the solder regions can endure higher stresses without failure than the solder regions joined to non-elongated bonding pads or through-vias. The locations of the centripetal elongated bonding pads or through-vias are selected according to the stresses suffered by the solder regions. Simulation results indicate that a package with centripetal bonding pads or through-vias have improved reliability and can endure more thermal circles before they fail.

In accordance with some embodiments of the present disclosure, a package includes a corner, a device die, a molding material molding the device die therein, and a plurality of bonding features. The plurality of bonding features includes a corner bonding feature at the corner, wherein the corner bonding feature is elongated. The plurality of bonding features further includes an additional bonding feature, which is non-elongated.

In accordance with alternative embodiments of the present disclosure, a package includes a device die having a front side and a backside, a molding material molding the device die therein, a dielectric layer on the backside of the device die, and a plurality of bonding pads. Each of the plurality of bonding pads has a portion in the dielectric layer. The plurality of bonding pads includes a corner bonding pad at the corner, wherein the corner bonding pad is elongated in a top view of the first package, and is centripetal, with a lengthwise direction extending toward a center of the first package. The plurality of bonding pads further includes an additional bonding pad farther away from the corner than the corner bonding pad. The additional bonding pad is non-elongated in the top view of the first package. A first solder region is bonded to the corner bonding pad. A second solder region is bonded to the additional bonding pad.

In accordance with alternative embodiments of the present disclosure, a method includes etching a first dielectric layer of a package to expose surfaces of a first bonding feature and a second bonding feature in the first package. The first bonding feature is elongated, and the second bonding feature is non-elongated. The package includes a device die, a molding material molding the device die therein, and a plurality of through-vias penetrating through the molding material. The method further includes forming a first solder region and a second solder region contacting the surfaces of the first bonding feature and the second bonding feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a package comprising:
encapsulating a device die and a through-via in an encapsulant;
forming a redistribution line electrically coupling to the through-via, wherein the redistribution line comprises a first metal pad, and a first via connecting the first metal pad to the through-via, and the first metal pad is elongated in a plane view of the package;
forming a first dielectric layer, wherein the redistribution line is in the first dielectric layer; and
forming a second dielectric layer, wherein the first metal pad contacts the second dielectric layer;
removing the second dielectric layer;
recessing the first dielectric layer to reveal sidewalls of the first metal pad; and
applying a solder region contacting a top surface and the revealed sidewalls of the first metal pad.

2. The method of claim 1, wherein the second dielectric layer is removed in an anisotropic etching.

3. The method of claim 1, wherein an entirety of the second dielectric layer is removed.

4. The method of claim 1 further comprising applying an underfill contacting the solder region and the first dielectric layer.

5. The method of claim 1, wherein the package further comprises a second metal pad, and the second metal pad is revealed after the second dielectric layer is removed, and the second metal pad is non-elongated in the plane view of the package.

6. The method of claim 5, wherein the first metal pad and the second metal pad have a same plane-view area.

7. A method comprising:
encapsulating a metal post and a device die in an encapsulant;
forming a first dielectric layer, wherein the device die is attached to the first dielectric layer through a die-attach film;
forming a first redistribution line in the first dielectric layer, wherein the first redistribution line comprises a first via and a first metal pad; and
etching the first dielectric layer to expose top portions of sidewalls of the first metal pad, wherein bottom portions of the sidewalls of the first metal pad are in contact with the first dielectric layer, and wherein both of the first metal pad and the metal post are elongated in a plane view of the first metal pad and the metal post.

8. The method of claim 7 further comprising forming a second redistribution line in the first dielectric layer, wherein the first redistribution line comprises a second via and a second metal pad, with the second metal pad having a non-elongated shape in the plane view, and wherein the first metal pad and the second metal pad have a same plane-view area.

9. The method of claim 7, wherein the first dielectric layer is partially etched in the etching.

10. The method of claim 9 further comprising, before the etching the first dielectric layer, removing an entirety of a second dielectric layer overlying the first dielectric layer to expose the first dielectric layer.

11. The method of claim 7 further comprising bonding a solder region contacting a top surface and sidewalls of the first metal pad.

12. A method comprising:
forming a package comprising:
encapsulating a device die and a through-via in an encapsulant;
forming a redistribution line electrically coupling to the through-via, wherein the redistribution line comprises a first metal pad, and a first via connecting the first metal pad to the through-via, and the first metal pad is elongated in a plane view of the package;

forming a first dielectric layer, wherein the redistribution line is in the first dielectric layer; and forming a second dielectric layer, wherein the first metal pad contacts the second dielectric layer;

removing the second dielectric layer;

recessing the first dielectric layer to reveal sidewalls of the first metal pad, wherein the recessing the first dielectric comprises etching the first dielectric layer; and applying a solder region contacting a top surface and the revealed sidewalls of the first metal pad, wherein at a time the solder region is applied, a bottom portion of the first dielectric layer remains.

13. The method of claim 12, wherein the second dielectric layer is removed in an anisotropic etching.

14. The method of claim 12, wherein an entirety of the second dielectric layer is removed.

15. The method of claim 12 further comprising applying an underfill contacting the solder region and the first dielectric layer.

16. The method of claim 12, wherein the package further comprises a second metal pad, and the second metal pad is revealed after the second dielectric layer is removed, and the second metal pad is non-elongated in the plane view of the package.

17. The method of claim 16, wherein the first metal pad and the second metal pad have a same plane-view area.

18. The method of claim 12, wherein the first metal pad is closest to a corner of a respective package than all other metal pads that extend into the first dielectric layer.

19. The method of claim 12 further comprising bonding a package component to the first metal pad through the solder region.

20. The method of claim 12, wherein the first via of the redistribution line physically contacts the through-via.

* * * * *